(12) United States Patent
Park et al.

(10) Patent No.: US 12,006,386 B2
(45) Date of Patent: Jun. 11, 2024

(54) ALKALI SOLUBLE, PHOTO-CURABLE AND THERMO-CURABLE COPOLYMER, AND PHOTOSENSITIVE RESIN COMPOSITION, PHOTOSENSITIVE RESIN FILM AND COLOR FILTER USING THE SAME

(71) Applicant: LG CHEM, LTD., Seoul (KR)

(72) Inventors: Hye Jin Park, Daejeon (KR); Changho Cho, Daejeon (KR)

(73) Assignee: LG CHEM, LTD., Seoul (KR)

( * ) Notice: Subject to any disclaimer, the term of this patent is extended or adjusted under 35 U.S.C. 154(b) by 795 days.

(21) Appl. No.: 17/058,473

(22) PCT Filed: Mar. 20, 2020

(86) PCT No.: PCT/KR2020/003843
§ 371 (c)(1),
(2) Date: Nov. 24, 2020

(87) PCT Pub. No.: WO2020/197179
PCT Pub. Date: Oct. 1, 2020

(65) Prior Publication Data
US 2021/0198402 A1    Jul. 1, 2021

(30) Foreign Application Priority Data
Mar. 27, 2019   (KR) ......................... 10-2019-0035267

(51) Int. Cl.
| | |
|---|---|
| *C08F 2/50* | (2006.01) |
| *C08F 220/18* | (2006.01) |
| *C08F 220/32* | (2006.01) |
| *C08F 265/06* | (2006.01) |
| *G03F 7/00* | (2006.01) |
| *G03F 7/028* | (2006.01) |

(52) U.S. Cl.
CPC .............. *C08F 220/32* (2013.01); *C08F 2/50* (2013.01); *C08F 220/18* (2013.01); *C08F 265/06* (2013.01); *G03F 7/0007* (2013.01); *G03F 7/028* (2013.01)

(58) Field of Classification Search
CPC ....................................................... C08F 220/32
USPC ................................................. 526/320, 328
See application file for complete search history.

(56) References Cited

U.S. PATENT DOCUMENTS

2007/0021571 A1   1/2007   Kamata et al.

FOREIGN PATENT DOCUMENTS

| CN | 101573663 B | 1/2013 |
|---|---|---|
| JP | 2005-008857 A | 1/2005 |
| JP | 2012-163735 A | 8/2012 |

(Continued)

OTHER PUBLICATIONS

Machine-generated English-language translation of WO-2016204346-A1.*

(Continued)

*Primary Examiner* — Vu A Nguyen
(74) *Attorney, Agent, or Firm* — ROTHWELL, FIGG, ERNST & MANBECK, P.C.

(57) ABSTRACT

The present invention relates to an alkali soluble, photo-curable and thermo-curable copolymer containing three types of (meth)acrylate repeating units classified by the type of functional groups present at the terminal, and a photosensitive resin composition, a photosensitive resin film, and a color filter using the same.

18 Claims, 2 Drawing Sheets

(56) References Cited

FOREIGN PATENT DOCUMENTS

| | | |
|---|---|---|
| JP | 2015-176152 A | 10/2015 |
| JP | 2017-072832 A | 4/2017 |
| JP | 2020-515680 A | 5/2020 |
| KR | 10-0655049 B1 | 12/2006 |
| KR | 10-2008-0059815 A | 7/2008 |
| KR | 10-2009-0081208 A | 7/2009 |
| KR | 10-2010-0079949 A | 7/2010 |
| KR | 10-2010-0096675 A | 9/2010 |
| KR | 10-2013-0135010 A | 12/2013 |
| KR | 10-2013-0135418 A | 12/2013 |
| KR | 10-2015-0139284 A | 12/2015 |
| KR | 10-2016-0001037 A | 1/2016 |
| KR | 10-2017-0031854 A | 3/2017 |
| KR | 10-2017-0104843 A | 9/2017 |
| KR | 10-2019-0053801 A | 5/2019 |
| TW | 201404790 A | 2/2014 |
| WO | 2016-204346 A1 | 12/2016 |
| WO | WO-2016204346 A1 * | 12/2016 ............ C08F 220/32 |

OTHER PUBLICATIONS

International Search Report issued for International Application No. PCT/KR2020/003843 dated Jun. 30, 2020, 4 pages.

* cited by examiner

[FIG. 1]
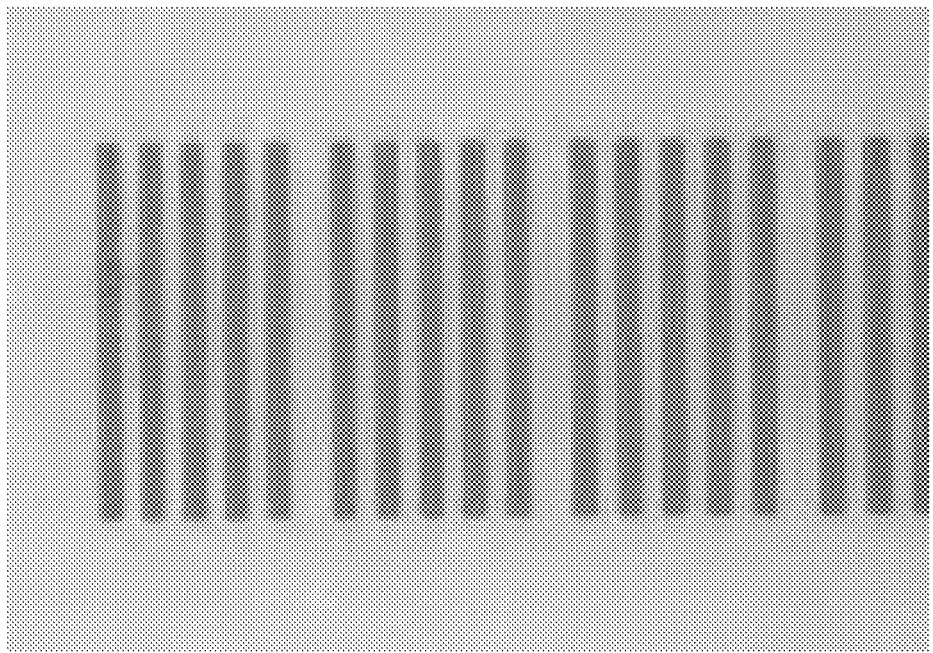
[FIG. 2]
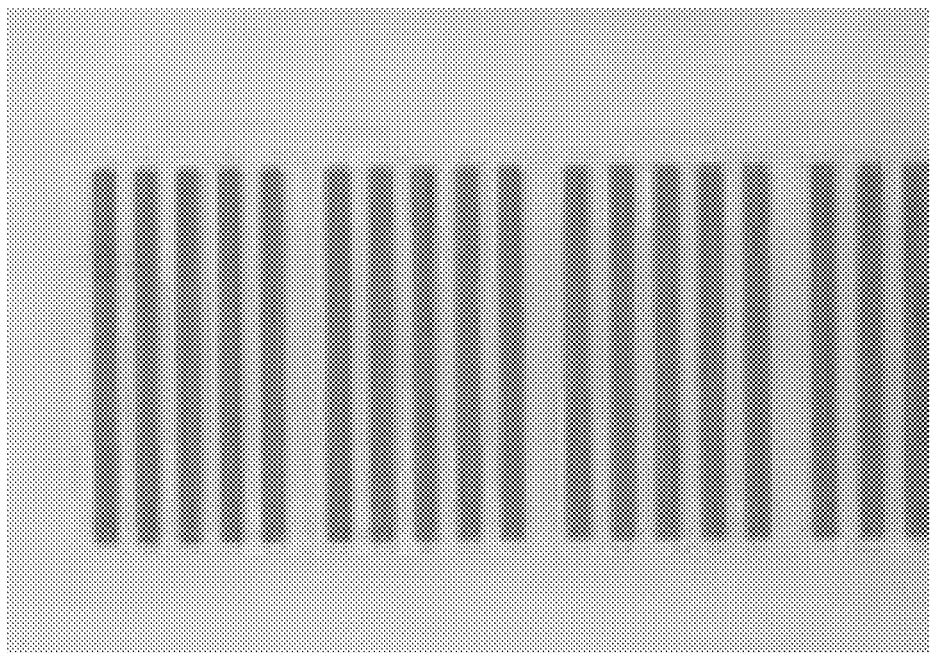

[FIG. 3]
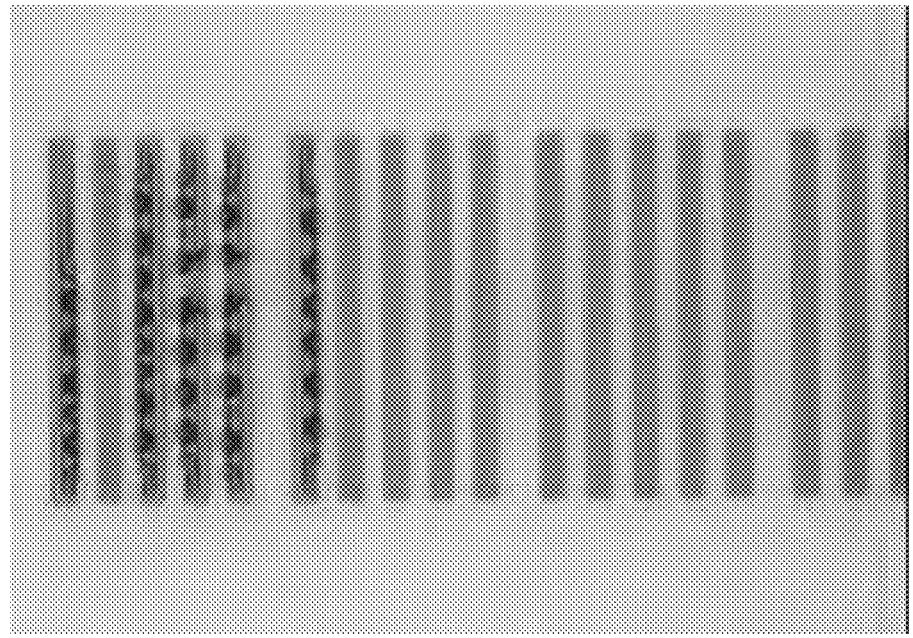
[FIG. 4]
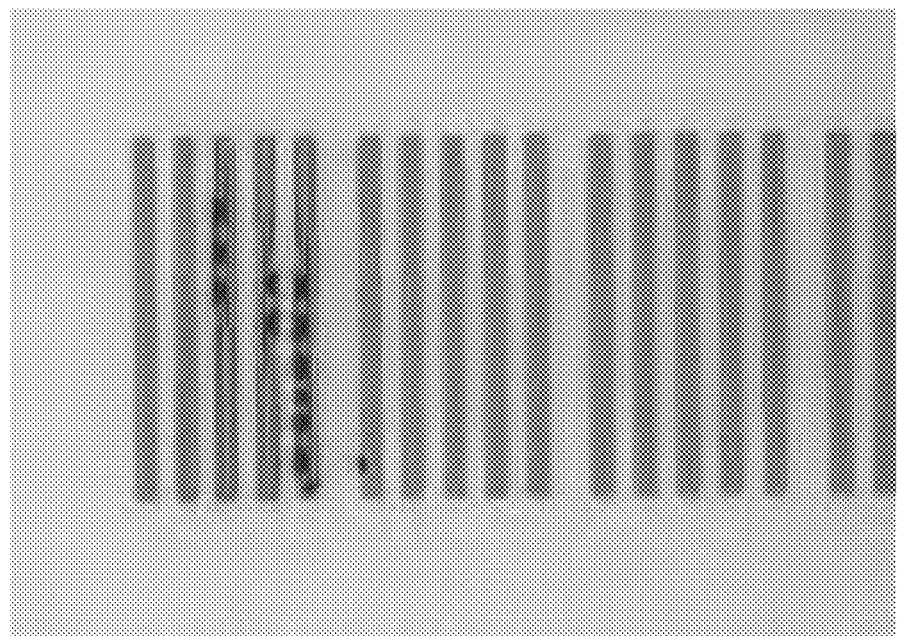

ALKALI SOLUBLE, PHOTO-CURABLE AND THERMO-CURABLE COPOLYMER, AND PHOTOSENSITIVE RESIN COMPOSITION, PHOTOSENSITIVE RESIN FILM AND COLOR FILTER USING THE SAME

CROSS-REFERENCE TO RELATED APPLICATION(S)

This application is a 35 U.S.C. 371 National Phase Entry Application from PCT/KR2020/003843, filed on Mar. 20, 2020, designating the United States and which claims the benefit of Korean Patent Application No. 10-2019-0035267 filed on Mar. 27, 2019 with the Korean Intellectual Property Office, the disclosures of which are herein incorporated by reference in their entirety.

TECHNICAL FIELD

The present invention relates to an alkali soluble, photo-curable and thermo-curable copolymer, and a photosensitive resin composition, a photosensitive resin film and a color filter using the same. More particularly, the present invention relates to a copolymer which has excellent thermal curability at relatively low temperature, can be photo-cured under light irradiation, can have enhanced curing degree and thus excellent durability and chemical resistance, and has increased alkali solubility and thus improved development property, and a photosensitive resin composition, a photosensitive resin film and a color filter using the same.

BACKGROUND OF THE INVENTION

In the case of RGB pattern in the color filter process, a photosensitive resin composition is mainly coated using a spin or slit coater, pre-baked, then exposed and developed.

Subsequent to development, finally, a post-baking process of applying heat of 220° C. or more is performed. The glass generally used does not substantially cause deformation at this temperature, but the plastic used for a flexible display has a problem that severe deformation occurs at a temperature of 220° C. or more.

In order to reduce the deformation of the substrate, a method of lowering the temperature of the post-baking process was used, but when the temperature of the post-baking process was lowered in this way, the curing of the photosensitive resin composition does not completely occur, and thus, it was limited because not only the amount of gas generated increases and afterimages appear, but also the chemical resistance and heat resistance decrease.

Accordingly, there is a need to develop a material and a photosensitive resin composition for forming a cured film which can perform a high level of curing even at low temperatures and thus, has excellent heat resistance and chemical resistance.

BRIEF SUMMARY OF THE INVENTION

The present invention provides an alkali soluble, photo-curable and thermo-curable copolymer which has excellent thermal curability at relatively low temperature, can be photocured by light irradiation, can have enhanced curing degree and thus excellent durability and chemical resistance, and has improved alkali solubility and thus improved development property.

The present invention also provides a photosensitive resin composition, a photosensitive resin film and a color filter using the above-mentioned alkali soluble, photo-curable and thermo-curable copolymer.

Provided herein is an alkali soluble, photo-curable and thermo-curable copolymer comprising: a first (meth)acrylate repeating unit in which an organic functional group including an epoxy group is bonded to a terminal of a branched chain; a second (meth)acrylate repeating unit in which an organic functional group including an alkenyl group is bonded to a terminal of a branched chain; and a third (meth)acrylate repeating unit in which an organic functional group including an alkenyl group is bonded to a terminal of a branched chain, wherein in the second (meth)acrylate repeating unit, the branched chain includes any one functional group of: an alkyl ester group having 1 to 20 carbon atoms substituted with a hydroxy group; an oxyalkyl ester group having 1 to 20 carbon atoms substituted with a hydroxy group; an alkyl ester group substituted by a cycloalkyl group having 3 to 30 carbon atoms substituted with a hydroxy group; a polycyclic alkyl ester group having 7 to 30 carbon atoms substituted with a hydroxy group; or an alkyl ester group substituted by a polycyclic alkyloxy group having 7 to 30 carbon atoms substituted with a hydroxy group, and wherein in the third (meth)acrylate repeating unit, the branched chain includes any one functional group of: an alkyl ester group having 1 to 20 carbon atoms in which a substituent containing a carboxyl group is introduced to the terminal; an oxyalkyl ester group having 1 to 20 carbon atoms in which a substituent containing a carboxyl group is introduced to the terminal; an alkyl ester group substituted by a cycloalkyl group having 3 to 30 carbon atoms in which a substituent containing a carboxyl group is introduced to the terminal; a polycyclic alkyl ester group having 7 to 30 carbon atoms in which a substituent containing a carboxyl group is introduced to the terminal; or an alkyl ester group substituted by a polycyclic alkyloxy group having 7 to 30 carbon atoms in which a substituent containing a carboxyl group is introduced to the terminal.

Also provided herein is a photosensitive resin composition comprising the above-mentioned alkali soluble, photo-curable and thermo-curable copolymer; a photopolymerizable monomer having two or more photocurable unsaturated functional groups; and a photo-initiator.

Further provided herein is a photosensitive resin film comprising a cured product of the above-mentioned photosensitive resin composition.

Further provided herein is a color filter comprising the above-mentioned photosensitive resin film.

DETAILED DESCRIPTION OF THE INVENTION

Throughout the specification, when a part is referred to as "including" a certain component, it means that it can further include other components, without excluding the other components, unless otherwise stated.

As used herein, the term "substituted" means that other functional groups instead of a hydrogen atom in the compound are bonded, and a position to be substituted is not limited as long as the position is a position at which the hydrogen atom is substituted, that is, a position at which the substituent can be substituted, and when two or more are substituted, the two or more substituents may be the same as or different from each other.

As used herein, the notation  or  means a bond linked to another substituent group, and a direct bond means a case where no other atoms exist in the parts represented as L.

As used herein, the "(meth)acryl" is meant to include both acryl and methacryl.

As used herein, a weight average molecular weight means a weight average molecular weight converted in terms of polystyrene, measured by GPC method. During the process of measuring weight average molecular weight converted in terms of polystyrene measured by GPC, commonly known analysis equipment and detectors such as refractive index detector, and analysis columns may be used, and commonly applied temperature condition, solvent, flow rate may be applied. Specific examples of the measurement conditions are as follows: Polymer Laboratories PLgel MIX-B 300 mm length column and Waters PL-GPC220 device were used, the evaluation temperature was 160° C., 1,2,4-trichlorobenzene was used as a solvent, a flow rate was 1 mL/min, a sample was prepared at a concentration of 10 mg/10 mL and then fed in the amount of 200 μL, and then a calibration curve formed using a polystyrene standard was used, thereby calculating Mw value. As the polystyrene standard, 9 kinds having molecular weight of 2,000/10,000/30,000/70,000/200,000/700,000/2,000,000/4,000,000/10,000,000 were used.

As used herein, the alkyl group is a monovalent functional group derived from an alkane, and may be a straight-chain, branched-chain or cyclic, and examples thereof may include methyl, ethyl, propyl, sec-butyl, tert-butyl, pentyl, hexyl, and the like. One or more hydrogen atoms contained in the alkyl group may be substituted with other substituents, and examples of the substituent include an alkyl group having 1 to 10 carbon atoms, an alkenyl group having 2 to 10 carbon atoms, an alkynyl group having 2 to 10 carbon atoms, an aryl group having 6 to 12 carbon atoms, a heteroaryl group having 2 to 12 carbon atoms, an arylalkyl group having 6 to 12 carbon atoms, a halogen atom, a cyano group, an amino group, an amidino group, a nitro group, an amide groups, a carbonyl group, a hydroxy group, a sulfonyl group, a carbamate group, an alkoxy group having 1 to 10 carbon atoms, and the like.

As used herein, the cycloalkyl group is a monovalent functional group derived from a monocyclic cycloalkane, without being limited thereto. The carbon number thereof is not particularly limited, but preferably, it is 3 to 60. According to one embodiment, the carbon number of the cycloalkyl group is 3 to 30. According to another embodiment, the carbon number of the cycloalkyl group is 3 to 20. According to another embodiment, the carbon number of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

As used herein, the polycyclic alkyl group is a monovalent functional group derived from a polycyclic cycloalkane, without being limited thereto. The carbon number thereof is not particularly limited, but preferably, it is 3 to 60. According to one embodiment, the carbon number of the cycloalkyl group is 3 to 30. Specific examples thereof include norbornyl, 2,3-trimethylenenorbornyl, and the like, but are not limited thereto.

As used herein, the aryl group is a monovalent functional group derived from arene, and may be, for example, monocyclic or polycyclic. Specific examples of the monocyclic aryl group may include a phenyl group, a biphenyl group, a terphenyl group, a stilbenyl group, and the like, but are not limited thereto. Specific examples of the polycyclic aryl group may include a naphthyl group, an anthryl group, a phenanthryl group, a pyrenyl group, a perylenyl group, a chrysenyl group, a fluorenyl group, and the like, but are not limited thereto. One or more hydrogen atoms of the aryl group may be substituted with the same substituent as in the alkyl group.

As used herein, the alkenyl group may be a straight chain or branched chain, and the carbon number thereof is not particularly limited, but is preferably 2 to 40. According to one embodiment, the carbon number of the alkenyl group is 2 to 20. According to another embodiment, the carbon number of the alkenyl group is 2 to 10. According to still another embodiment, the carbon number of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

As used herein, the alkylene group is a bivalent functional group derived from an alkane, and the carbon number thereof is 1 to 20, or 1 to 10, or 1 to 5. The alkylene group may be a straight chain, branched chain or cyclic, examples of which include a methylene group, an ethylene group, a propylene group, an isobutylene group, a sec-butylene group, a tert-butylene group, a pentylene group, a hexylene group, and the like. One or more hydrogen atoms contained in the alkylene group may be substituted with the same substituent as in the alkyl group.

As used herein, the oxyalkylene group is a functional group derived from the alkylene group, and has a structure in which an ether group (—O—) is bonded to one terminal of the alkylene group, and the carbon number thereof is 1 to 20, or 1 to 10, or 1 to 5. The oxyalkylene group is a straight chain, or a branched chain or cyclic, examples of which include an oxymethylene group, an oxyethylene group, an oxypropylene group, an oxy-n-butylene group, an oxy-isobutylene group, an oxy-sec-butylene group, an oxy-tert-butylene group, an oxypentylene group, an oxyhexylene group, and the like. One or more hydrogen atoms contained in the oxyalkylene group can be substituted with the same substituent as in the alkyl group.

As used herein, the cycloalkylene group is a divalent group derived from a cycloalkane, and the carbon number thereof is 3 to 30, or 3 to 20, or 3 to 10. Examples thereof include cyclopropylene, cyclobutylene, cyclopentylene, 3-methylcyclopentylene, 2,3-dimethylcyclopentylene, cyclohexylene, 3-methylcyclohexylene, 4-methylcyclohexylene, 2,3-dimethylcyclohexylene, 3,4,5-trimethylcyclohexylene, 4-tert-butylcyclohexylene, cycloheptylene, cyclooctylene, and the like, but are not limited thereto.

As used herein, the polycyclic alkylene group is a divalent functional group derived from a multicyclic alkane which is a polycyclic cycloalkane, and means that one hydrogen atom in the polycyclic alkyl group is substituted with one functional group.

In this specification, the carbon number of the carbonyl group is not particularly limited, but is preferably 1 to 30. Specifically, it may be a compound having the following structure, but is not limited thereto.

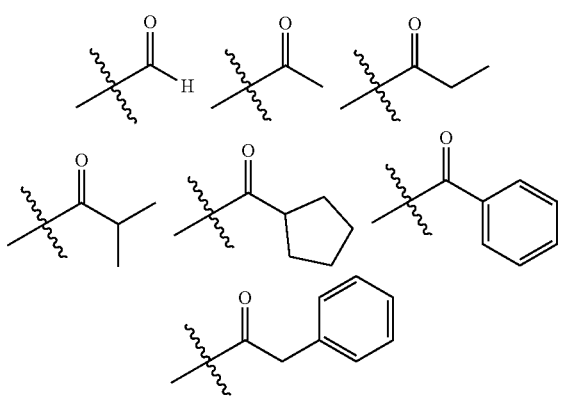

As used herein, the ester group has a structure in which oxygen of the ester group may be substituted by a straight-chain, branched-chain, or cyclic alkyl group having 1 to 25 carbon atoms. The ester group substituted with the alkyl group may be referred to as an "alkyl ester group" and the ester group substituted with the polycyclic alkyl group may be referred to as a "polycyclic alkyl ester group".

Hereinafter, an alkali soluble, photo-curable and thermo-curable copolymer, and a photosensitive resin composition, a photosensitive resin film and a color filter using the same according to specific embodiments of the present invention will be described in more detail.

I. Alkali Soluble, Photo-Curable and Thermo-Curable Copolymer

According to one embodiment of the present invention, there can be provided an alkali soluble, photo-curable and thermo-curable copolymer comprising: a first (meth)acrylate repeating unit in which an organic functional group including an epoxy group is bonded to a terminal of a branched chain; a second (meth)acrylate repeating unit in which an organic functional group including an alkenyl group is bonded to a terminal of a branched chain; and a third (meth)acrylate repeating unit in which an organic functional group including an alkenyl group is bonded to a terminal of a branched chain, wherein in the second (meth)acrylate repeating unit, the branched chain includes any one functional group of: an alkyl ester group having 1 to 20 carbon atoms substituted with a hydroxy group; an oxyalkyl ester group having 1 to 20 carbon atoms substituted with a hydroxy group; an alkyl ester group substituted by a cycloalkyl group having 3 to 30 carbon atoms substituted with a hydroxy group; a polycyclic alkyl ester group having 7 to 30 carbon atoms substituted with a hydroxy group; or an alkyl ester group substituted by a polycyclic alkyloxy group having 7 to 30 carbon atoms substituted with a hydroxy group, and wherein in the third (meth)acrylate repeating unit, the branched chain includes any one functional group of: an alkyl ester group having 1 to 20 carbon atoms in which a substituent containing a carboxyl group is introduced to the terminal; an oxyalkyl ester group having 1 to 20 carbon atoms in which a substituent containing a carboxyl group is introduced to the terminal; an alkyl ester group substituted by a cycloalkyl group having 3 to 30 carbon atoms in which a substituent containing a carboxyl group is introduced to the terminal; a polycyclic alkyl ester group having 7 to 30 carbon atoms in which a substituent containing a carboxyl group is introduced to the terminal; or an alkyl ester group substituted by a polycyclic alkyloxy group having 7 to 30 carbon atoms in which a substituent containing a carboxyl group is introduced to the terminal.

The present inventors have found through experiments that in the case of the photo-curable and thermo-curable copolymer containing two types of the repeating units of the first (meth)acrylate repeating unit and the second (meth)acrylate repeating unit, an organic functional group including an alkenyl group contained in the second (meth)acrylate repeating unit can be photo-cured under light irradiation to form a primary cured structure, and an organic functional group including an epoxy group contained in the first (meth)acrylate repeating unit is thermally cured even at a low temperature of less than 200° C. to form a secondary cured structure, whereby sufficient curing can be performed by thermal curing and photocuring even at a low temperature and thus, the final cured film can have excellent durability and chemical resistance, and the photosensitive resin composition before being cured also has excellent storage stability. On the basis of these findings, the present invention has been completed.

Also, the alkali soluble, photo-curable and thermo-curable copolymer of one embodiment may further include a third (meth)acrylate repeating unit in addition to the first (meth)acrylate repeating unit and the second (meth)acrylate repeating unit. Due to the carboxyl group existing at the terminal of the substituent introduced to the branched chain in the third (meth)acrylate repeating unit, the alkali solubility is increased, and the development property of the acrylic resin developer can be sufficiently secured. Further, as a crosslinking reaction of the epoxy group contained in the first (meth)acrylate repeating unit or the (meth)acrylic functional group contained in the second (meth)acrylate repeating unit is performed at a low temperature to form a secondary cured structure, the degree of thermal curing is further improved and the finally cured film may have excellent durability and chemical resistance.

Specifically, the alkali soluble, photo-curable and thermo-curable copolymer may include a first (meth)acrylate repeating unit in which an organic functional group including an epoxy group is bonded to the terminal of a branched chain. By including the first (meth)acrylate repeating unit, thermal curing can be performed by the epoxy group contained in the first (meth)acrylate repeating unit even at a low temperature of less than 200° C. to form a dense cured structure.

In the first (meth)acrylate repeating unit, a chain formed through a polymerization reaction of a double bond contained in the (meth)acrylate is referred to as a main chain, and a chain extending in the form of branches from the main chain is referred to as a branched chain or a side chain.

The (meth)acrylate repeating unit is a repeating unit contained in a homopolymer of the (meth)acrylate monomer, and may include a polyethylene chain by polymerization of a vinyl group contained in the (meth)acrylate monomer as a main chain, and an ester functional group contained in the (meth)acrylate monomer as a branched chain. That is, in the first (meth)acrylate repeating unit, the terminal of the branched chain to which the organic functional group including an epoxy group is bonded may mean a terminal of the ester functional group contained in the (meth)acrylate repeating unit.

In the first (meth)acrylate repeating unit, the branched chain may include any one functional group of: a carbonyl group (—CO—); an alkyl ester group having 1 to 20 carbon atoms (R'COO—: R' is an alkyl group having 1 to 20 carbon atoms); or an oxyalkyl ester group having 1 to 20 carbon atoms, and the organic functional group including the epoxy group may be bonded to the terminal of the carbonyl group or the alkyl group having 1 to 20 carbon atoms included in alkyl ester group having 1 to 20 carbon atoms.

The organic functional group including the epoxy group may include both a functional group composed of only the epoxy group and a functional group in which the epoxy group is bonded with other organic functional groups. Specific examples thereof include any one functional group of: a functional group represented by the following Chemical Formula 1; a functional group represented by the following Chemical Formula 2; or a functional group represented by the following Chemical Formula 3.

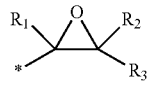

[Chemical Formula 1]

In the Chemical Formula 1, $R_1$, $R_2$, and $R_3$ may each independently be any one of a direct bond, hydrogen, or an alkyl group having 1 to 5 carbon atoms, preferably, $R_1$, $R_2$, and $R_3$ all may be hydrogen.

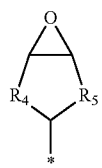

[Chemical Formula 2]

In the Chemical Formula 2, $R_4$, and $R_5$ may each independently be any one of a direct bond, or an alkylene group having 1 to 5 carbon atoms, preferably, $R_4$ may be a methylene group having 1 carbon atom, and $R_5$ may be an ethylene group having 2 carbon atoms.

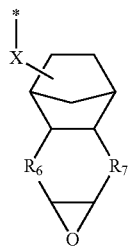

[Chemical Formula 3]

In the Chemical Formula 3, $R_6$, and $R_7$ are each independently any one of a direct bond, or an alkylene group having 1 to 5 carbon atoms, and X is a direct bond, —O—, or —S—.

Specifically, the first (meth)acrylate repeating unit may be represented by the following Chemical Formula 4.

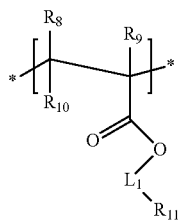

[Chemical Formula 4]

In the Chemical Formula 4, $R_8$ to $R_{10}$ are each independently any one of hydrogen or an alkyl group having 1 to 10 carbon atoms, $L_1$ is any one of a direct bond, or an alkylene group having 1 to 20 carbon atoms or an oxyalkylene group having 1 to 20 carbon atoms, and $R_{11}$ is an organic functional group including an epoxy group.

Preferably, in Chemical Formula 4, $R_8$ and $R_{10}$ are each independently hydrogen, $R_9$ is an alkyl group having 1 to 3 carbon atoms, $L_1$ is any one of a direct bond, or an alkylene group having 1 to 3 carbon atoms, and $R_{11}$ is any one of the functional group represented by Chemical Formula 1, the functional group represented by Chemical Formula 2, or the functional group represented by Chemical Formula 3.

More preferably, in Chemical Formula 4, $L_1$ is a direct bond, and $R_{11}$ may be a functional group represented by Chemical Formula 3. Also, in Chemical Formula 4, $L_1$ is an alkylene group having 1 to 3 carbon atoms, and $R_{11}$ may be a functional group represented by Chemical Formula 1, a functional group represented by Chemical Formula 2, or a functional group represented by Chemical Formula 3.

Specifically, examples of the first (meth)acrylate repeating unit represented by Chemical Formula 4 include the following Chemical Formula 4-1 derived from glycidyl methacrylate, or the following Chemical Formula 4-2 derived from 3,4-epoxycyclohexylmethyl methacrylate, or the following Chemical Formula 4-3 derived from Chemical Formula A of Synthesis Example 3 below, or the following Chemical Formula 4-4 derived from Chemical Formula B of Synthesis Example 4 below.

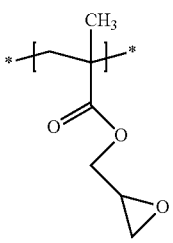

[Chemical Formula 4-1]

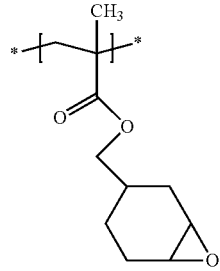

[Chemical Formula 4-2]

-continued

[Chemical Formula 4-3]

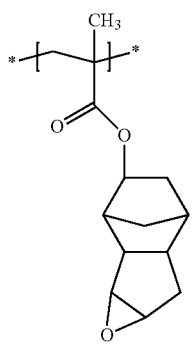

[Chemical Formula 4-4]

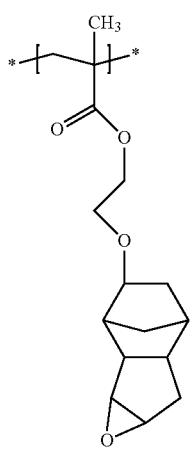

That is, the first (meth)acrylate repeating unit may be derived from a resultant polymerization reaction product of a (meth)acrylate monomer in which an organic functional group including an epoxy group is substituted at the terminal end, and examples of the (meth)acrylate monomer in which an organic functional group including an epoxy group is substituted at the terminal include glycidyl methacrylate, or 3,4-epoxycyclohexylmethylmethacrylate, or the Chemical Formula 4-3 derived from Chemical Formula A of Synthesis Example 3 below, the Chemical Formula 4-4 derived from Chemical Formula B of Synthesis Example 4 below.

Meanwhile, the alkali soluble, photo-curable and thermo-curable copolymer may include a second (meth)acrylate repeating unit in which an organic functional group including an alkenyl group is bonded to the terminal of a branched chain. By including the second (meth)acrylate repeating unit, photocuring can be performed under light irradiation by the alkenyl group contained in the second (meth)acrylate repeating unit to form a dense cured structure.

In the second (meth)acrylate repeating unit, a chain formed through a polymerization reaction of a double bond contained in the (meth)acrylate is referred to as a main chain, and a chain extending in the form of branches from the main chain is referred to as a branched chain or a side chain.

The (meth)acrylate repeating unit is a repeating unit contained in the homopolymer of the (meth)acrylate monomer, and may include a polyethylene chain by polymerization of a vinyl group contained in the (meth)acrylate monomer as a main chain, and an ester functional group contained in the (meth)acrylate monomer as a branched chain. That is, in the second (meth)acrylate repeating unit, the terminal of the branched chain to which the organic functional group including an alkenyl group is bonded may mean a terminal of the ester functional group contained in the (meth)acrylate repeating unit.

In the second (meth)acrylate repeating unit, the branched chain may include any one functional group of: an alkyl ester group having 1 to 20 carbon atoms or 1 to 10 carbon atoms substituted with a hydroxy group (R'COO—: R' is an alkyl group having 1 to 10 carbon atoms), an oxyalkyl ester group having 1 to 20 carbon atoms substituted with a hydroxy group, an alkyl ester group substituted by a cycloalkyl group having 3 to 30 carbon atoms or 3 to 10 carbon atoms substituted with a hydroxy group, a polycyclic alkyl ester group having 7 to 30 carbon atoms or 8 to 15 carbon atoms substituted with a hydroxy group, or an alkyl ester group substituted by a polycyclic alkyloxy group having 7 to 30 carbon atoms or 8 to 15 carbon atoms substituted with a hydroxy group.

Specifically, the organic functional group including the alkenyl group may be substituted at the terminal of the alkyl group having 1 to 20 carbon atoms contained in the alkyl ester group having 1 to 20 carbon atoms substituted with the hydroxy group, or the cycloalkyl group having 3 to 30 carbon atoms contained in the alkyl ester group substituted by the cycloalkyl group having 3 to 30 carbon atoms substituted with the hydroxy group.

Further, in the polycyclic alkyl ester group having 7 to 30 carbon atoms substituted with a hydroxy group, the organic functional group including the alkenyl group may be substituted at the terminal of the polycyclic alkyl group having 7 to 30 carbon atoms contained in the polycyclic alkyl ester group having 7 to 30 carbon atoms.

Further, in the alkyl ester group substituted by a polycyclic alkyloxy group having 7 to 30 carbon atoms substituted with a hydroxy group, the organic functional group including the alkenyl group may be substituted at the terminal of the polycyclic alkyl group having 7 to 30 carbon atoms contained in the polycyclic alkyloxy group having 7 to 30 carbon atoms.

Meanwhile, the hydroxy group may be substituted with a branched chain of an alkyl group having 1 to 10 carbon atoms contained in an alkyl ester group having 1 to 20 carbon atoms, or be substituted with the cycloalkyl group having 3 to 30 carbon atoms, or be substituted with a polycyclic alkyl group having 10 to 30 carbon atoms contained in the polycyclic alkyl ester group having 10 to 30 carbon atoms, or be substituted by a polycyclic alkyl group having 10 to 30 carbon atoms contained in the polycyclic alkyloxy group having 10 to 30 carbon atoms.

The hydroxy group can be derived through a ring-opening reaction of the epoxy group contained in the above-mentioned first (meth)acrylate repeating unit, more specifically, it may be derived through a reaction between an epoxy group contained in the first (meth)acrylate repeating unit, and a compound containing an organic functional group including an alkenyl group.

The organic functional group including the alkenyl group may include a functional group composed of only the alkenyl group and/or a functional group in which the alkenyl group is bonded with other organic functional groups. Specifically, a (meth)acryloyl group, a (meth)acryloyloxy group, or the like can be used, and preferably a methacryloyloxy group can be used.

Specifically, the second (meth)acrylate repeating unit may be represented by the following Chemical Formula 5.

[Chemical Formula 5]

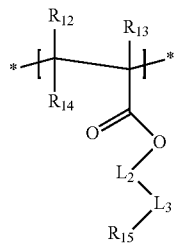

In the Chemical Formula 5, $R_{12}$ to $R_{14}$ are each independently any one of hydrogen or an alkyl group having 1 to 10 carbon atoms, $L_2$ is any one of a direct bond or an alkylene group having 1 to 20 carbon atoms, or an oxyalkylene group having 1 to 20 carbon atoms, $L_3$ is any one functional group of an alkylene group having 1 to 20 carbon atoms substituted with a hydroxy group, an oxyalkylene group having 1 to 20 carbon atoms substituted with a hydroxy group, a cycloalkylene group having 3 to 30 carbon atoms substituted with a hydroxy group, or a polycyclic alkylene group having 7 to 30 carbon atoms substituted with a hydroxy group, and $R_{15}$ is an organic functional group including an alkenyl group.

Preferably, in Chemical Formula 5, $R_{12}$ and $R_{14}$ are each independently hydrogen, $R_{13}$ is an alkyl group having 1 to 3 carbon atoms, $L_2$ is any one of a direct bond or an alkylene group having 1 to 10 carbon atoms, an oxyalkylene group having 1 to 10 carbon atoms, $L_3$ is an alkylene group having 1 to 5 carbon atoms substituted with a hydroxy group, or a cycloalkylene group having 3 to 10 carbon atoms substituted with a hydroxy group, or a polycyclic alkylene group having 8 to 15 carbon atoms substituted with a hydroxy groups.

More preferably, in Chemical Formula 5, while $L_2$ is a direct bond, $L_3$ may be a polycyclic alkylene group having 10 to 20 carbon atoms substituted with a hydroxy group. Also, in Chemical Formula 5, $L_2$ is an alkylene group having 1 to 10 carbon atoms, or an oxyalkylene group having 1 to 10 carbon atoms, and $L_3$ may be any one of an alkylene group having 1 to 5 carbon atoms substituted with a hydroxy group, or a cycloalkylene group having 3 to 10 carbon atoms substituted with a hydroxy group, or a polycyclic alkylene group having 8 to 15 carbon atoms substituted with a hydroxy group.

Specifically, examples of the second (meth)acrylate repeating unit represented by Chemical Formula 5 include the following Chemical Formula 5-1 to Chemical Formula 5-4, which may be prepared by reacting the terminal epoxy group in the above-mentioned Chemical Formulas 4-1 to 4-4 with the (meth)acrylic acid.

[Chemical Formula 5-1]

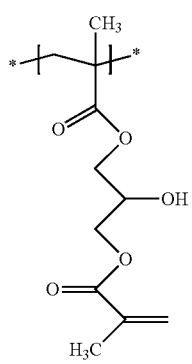

[Chemical Formula 5-2]

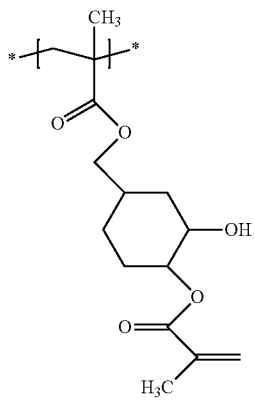

[Chemical Formula 5-3]

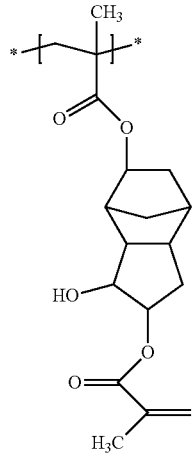

[Chemical Formula 5-4]

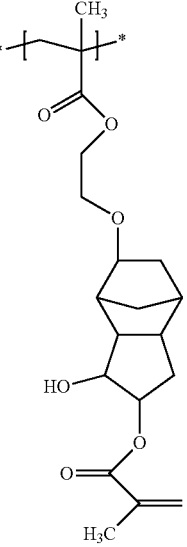

That is, the second (meth)acrylate repeating unit may be derived from a reaction product between a resultant polymerization reaction product of a (meth)acrylate monomer in which an organic functional group including an epoxy group is substituted at the terminal end, and a compound containing an organic functional group including an alkenyl group, and examples of the compound containing an organic functional group including the alkenyl group include methacrylic acid.

The first (meth)acrylate repeating unit may be contained in an amount of 5 mol % or more, or 5 mol % or more and 60 mol % or less, or 5 mol % or more and 50 mol % or less, or 10 mol or more and 50 mol % or less based on all repeating units contained in the copolymer. When the content of the first (meth)acrylate repeating unit is excessively increased, residue problems may occur in the synthesized copolymer. When the content of the first (meth)acrylate repeating unit is excessively reduced, it may cause a problem that migration properties and chemical resistance are deteriorated.

Meanwhile, the molar ratio between the first (meth) acrylate repeating unit and the second (meth)acrylate repeating unit may be 99:1 to 1:19. The molar ratio of 99:1 to 1:19 means a molar ratio between the first (meth)acrylate repeating unit and the second (meth)acrylate repeating unit. Specifically, when the molar ratio is 99:1, it means a case where the following proportional expression is established.

First (meth)acrylate repeating unit: Second (meth)acrylate repeating unit=99:1

Also, when the molar ratio is 1:19, it means a case where the following proportional expression is established.

First (meth)acrylate repeating unit: Second (meth)acrylate repeating unit=1:19

In this manner, the photo-curable and thermo-curable copolymer contains both the first (meth)acrylate repeating unit and the second (meth)acrylate repeating unit, and thereby, the photo-curability and the low-temperature thermal curability can be realized at the same time.

Preferably, the second (meth)acrylate repeating unit may contain in the ratio of 1 mol to 90 mol, or 5 mol to 80 mol, or 10 mol to 80 mol, based on 100 mol of the first (meth)acrylate repeating unit.

Meanwhile, the photo-curable and thermo-curable copolymer may include a third (meth)acrylate repeating unit in which an organic functional group including an alkenyl group is bonded to a terminal of a branched chain. By including the third (meth)acrylate repeating unit, the photocuring can be performed under light irradiation by the alkenyl group contained in the third (meth)acrylate repeating unit to form a dense cured structure, and the alkali solubility is increased by the carboxyl group contained in the third (meth)acrylate repeating unit, and excellent development property is secured, and additional thermal curing can be performed to form a more dense cured structure.

In the third (meth)acrylate repeating unit, the chain formed through the polymerization reaction of the double bond contained in the (meth)acrylate is referred to as a main chain, and the chain extending in the form of branches from the main chain is referred to as a branched chain or a side chain.

The (meth)acrylate repeating unit is a repeating unit contained in a homopolymer of the (meth)acrylate monomer, and may include a polyethylene chain by polymerization of a vinyl group contained in the (meth)acrylate monomer as a main chain, and an ester functional group contained in the (meth)acrylate monomer as a branched chain. That is, in the third (meth)acrylate repeating unit, the terminal of the branched chain to which the organic functional group including an alkenyl group is bonded may mean a terminal of the ester functional group contained in the (meth)acrylate repeating unit.

In the third (meth)acrylate repeating unit, the branched chain may include any one functional group of: an alkyl ester group having 1 to 20 carbon atoms in which a substituent containing a carboxyl group is introduced to the terminal; an oxyalkyl ester group having 1 to 20 carbon atoms in which a substituent containing a carboxyl group is introduced to the terminal; an alkyl ester group substituted by a cycloalkyl group having 3 to 30 carbon atoms in which a substituent containing a carboxyl group is introduced to the terminal; a polycyclic alkyl ester group having 7 to 30 carbon atoms in which a substituent containing a carboxyl group is introduced to the terminal; or an alkyl ester group substituted by a polycyclic alkyloxy group having 7 to 30 carbon atoms in which a substituent containing a carboxyl group is introduced to the terminal.

Specifically, the organic functional group including the alkenyl group may be substituted at the terminal of an alkyl group having 1 to 20 carbon atoms contained in an alkyl ester group having 1 to 20 carbon atoms in which a substituent containing a carboxy group is introduced to the terminal end, or a cycloalkyl group having 3 to 30 carbon atoms contained in an alkyl ester group substituted by a cycloalkyl group having 3 to 30 carbon atoms in which a substituent containing a carboxy group is introduced to the terminal.

Further, in the polycyclic alkyl ester group having 7 to 30 carbon atoms in which a substituent containing a carboxyl group is introduced at the terminal end, the organic functional group including the alkenyl group may be substituted at the terminal of the polycyclic alkyl group having 7 to 30 carbon atoms contained in the polycyclic alkyl ester group having 7 to 30 carbon atoms.

Further, in the alkyl ester group substituted by a polycyclic alkyloxy group having 7 to 30 carbon atoms in which a substituent containing a carboxyl group is introduced to the terminal end, the organic functional group including the alkenyl group may be substituted at the terminal of the polycyclic alkyl group having 7 to 30 carbon atoms contained in the polycyclic alkyloxy group having 7 to 30 carbon atoms.

Meanwhile, the substituent containing a carboxy group at the terminal may be substituted with a branched chain of an alkyl group having 1 to 10 carbon atoms contained in an alkyl ester group having 1 to 20 carbon atoms, or be substituted by a cycloalkyl group having 3 to 30 carbon atoms, or be substituted with a polycyclic alkyl group having 10 to 30 carbon atoms contained in the polycyclic alkyl ester group having 10 to 30 carbon atoms, or be substituted by a polycyclic alkyl group having 10 to 30 carbon atoms contained in the polycyclic alkyloxy group having 10 to 30 carbon atoms.

The substituent containing a carboxy group at the terminal can be derived through a reaction between a hydroxy group contained in the second (meth)acrylate repeating unit and an acid anhydride. Examples of the acid anhydride are not particularly limited, and for example, may include one or more selected from the group consisting of succinic anhydride, phthalic anhydride, trans-1,2-cyclohexanedicarboxylic anhydride, cis-1,2-cyclohexanedicarboxylic anhydride, hexahydro-4-methylphthalic anhydride and 1,2,3,6-tetrahydrophthalic anhydride.

Specifically, the substituent including a carboxyl group at the terminal contained in the third (meth)acrylate repeating unit may be represented by the following Chemical Formula 6.

[Chemical Formula 6]

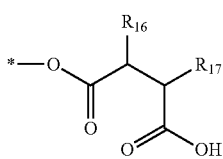

In the Chemical Formula 6, $R_{16}$ and $R_{17}$ are each independently hydrogen, or are bonded to each other to form an aliphatic ring or an aromatic ring. Specific examples of the aliphatic ring or aromatic ring are not particularly limited, and various types of organic ring compound structures may be applied without limitation.

More specifically, the functional group represented by Chemical Formula 6 may include a functional group represented by the following Chemical Formula 6-1 wherein $R_{16}$ and $R_{17}$ are each independently hydrogen, or a functional group of the following Chemical Formula 6-2 wherein $R_{16}$ and $R_{17}$ are bonded to each other to form an aliphatic ring.

The functional group of Chemical Formula 6-1 is a functional group derived from succinic anhydride, and the functional group of Chemical Formula 6-2 is a functional group derived from 1,2,3,6-tetrahydrophthalic anhydride.

[Chemical Formula 6-1]

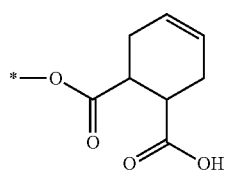

[Chemical Formula 6-2]

The organic functional group including an alkenyl group may include both a functional group composed of only the alkenyl group or a functional group in which the alkenyl group is bonded to other organic functional groups. Specifically, a (meth)acryloyl group, a (meth)acryloyloxy group, or the like can be used, and preferably a methacryloyloxy group can be used.

Specifically, the third (meth)acrylate repeating unit may be represented by the following Chemical Formula 7.

[Chemical Formula 7]

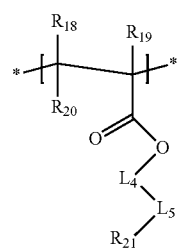

In the Chemical Formula 7, $R_{18}$ to $R_{20}$ are each independently hydrogen or an alkyl group having 1 to 10 carbon atoms, $L_4$ is any one functional group of: a direct bond, an alkylene group having 1 to 20 carbon atoms, or an oxyalkylene groups having 1 to 20 carbon atoms, $L_5$ is any one functional group of an alkylene group having 1 to 20 carbon atoms in which a substituent containing a carboxyl group is introduced to the terminal end, an oxyalkylene group having 1 to 20 carbon atoms in which a substituent containing a carboxy group at the terminal is introduced to the terminal end, a cycloalkylene group having 3 to 30 carbon atoms in which a substituent containing a carboxy group is introduced to the terminal end, or a polycyclic alkylene group having 7 to 30 carbon atoms in which a substituent containing a carboxyl group is introduced to the terminal end, and $R_{21}$ is an organic functional group including an alkenyl group.

Preferably, in Chemical Formula 7, $R_{18}$, and $R_{20}$ are each independently hydrogen, $R_{19}$ is an alkyl group having 1 to 3 carbon atoms, $L_4$ is a direct bond or an alkylene group having 1 to 10 carbon atoms, an oxyalkylene group having 1 to 10 carbon atoms, $L_5$ is an alkylene group having 1 to 5 carbon atoms in which a substituent containing a carboxy group is introduced to the terminal end, a cycloalkylene group having 3 to 10 carbon atoms in which a substituent containing a carboxyl group is introduced to the terminal end, or a polycyclic alkylene group having 8 to 15 carbon atoms in which a substituent containing a carboxy group is introduced to the terminal end.

More preferably, in Chemical Formula 7, while $L_4$ is a direct bond, $L_5$ may be a polycyclic alkylene group having 10 to 20 carbon atoms in which a substituent containing a carboxyl group is introduced to the terminal. Further, in Chemical Formula 7, $L_4$ is an alkylene group having 1 to 10 carbon atoms, or an oxyalkylene group having 1 to 10 carbon atoms, and $L_5$ is an alkylene group having 1 to 5 carbon atoms in which a substituent containing a carboxyl group is introduced to the terminal end, a cycloalkylene group having 3 to 10 carbon atoms in which a substituent containing a carboxyl group is introduced to the terminal end, or a polycyclic alkylene group having 8 to 15 carbon atoms in which a substituent containing a carboxyl group is introduced to the terminal end.

Specifically, examples of the third (meth)acrylate repeating unit represented by Chemical Formula 7 include the following Chemical Formula 7-1 to Chemical Formula 7-4, which can be prepared by reacting the terminal hydroxy group in Chemical Formulas 5-1 to 5-4 with the acid anhydride.

[Chemical Formula 7-1]

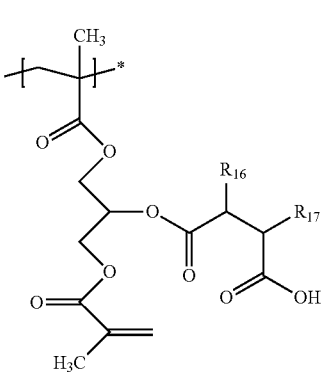

[Chemical Formula 7-2]

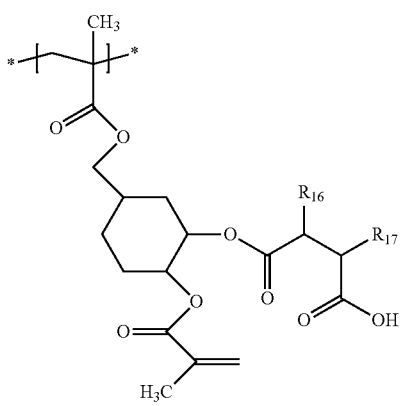

[Chemical Formula 7-3]

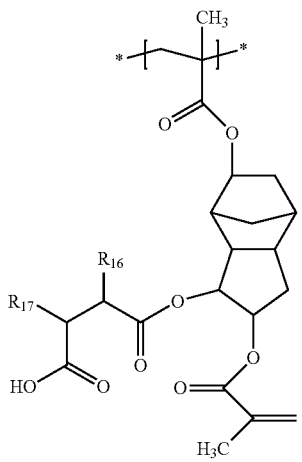

[Chemical Formula 7-4]

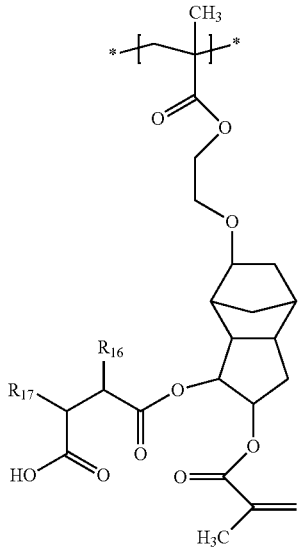

In the Chemical Formula 7-1 to Chemical Formula 7-4, $R_{16}$ and $R_{17}$ are each independently hydrogen, or are bonded to each other to form an aliphatic ring or an aromatic ring. Specific examples of the aliphatic ring or aromatic ring are not particularly limited, and various types of organic ring compound structures may be applied without limitation.

That is, the third (meth)acrylate repeating unit may be derived from a resultant reaction product between: a reaction product between a resultant polymerization reaction product of a (meth)acrylate monomer in which an organic functional group including an epoxy group is substituted at the terminal end, and a compound containing an organic functional group including an alkenyl group, and examples of the compound containing an organic functional group including the alkenyl group include methacrylic acid; and acid anhydride. Examples of the acid anhydride may include one or more selected from the group consisting of succinic anhydride, phthalic anhydride, trans-1,2-cyclohexanedicarboxylic anhydride, cis-1,2-cyclohexanedicarboxylic anhydride, hexahydro-4-methylphthalic anhydride and 1,2,3,6-tetrahydrophthalic anhydride.

Meanwhile, the molar content of the first (meth)acrylate repeating unit may be 20 mol or more and 500 mol or less, or 20 mol or more and 300 mol or less, or 30 mol or more and 250 mol or less, or 33 mol or more and 240 mol or less based on the total mole number 100 mol of the second (meth)acrylate repeating unit and the third (meth)acrylate repeating unit.

If the content of the first (meth)acrylate repeating unit is excessively reduced relative to the total mole number of the second (meth)acrylate repeating unit and the third (meth)acrylate repeating unit, it may be difficult to sufficiently implement low-temperature thermal curability, migration and chemical resistance effects due to the first (meth)acrylate repeating unit.

On the other hand, if the content of the first (meth)acrylate repeating unit is excessively increased relative to the total mole number of the second (meth)acrylate repeating unit and the third (meth)acrylate repeating unit, development residue problems can occur.

The molar ratio between the second (meth)acrylate repeating unit and the third (meth)acrylate repeating unit may be 99:1 to 1:99, or 1:1 to 1:99, or 1:2 to 1:20, or 1:2 to 1:5. The molar ratio of 99:1 to 1:99 means a molar ratio between the second (meth)acrylate repeating unit and the third (meth)acrylate repeating unit. Specifically, when the molar ratio is 99:1, it means a case where the following proportional expression is established.

Second (meth)acrylate repeating unit: Third (meth)acrylate repeating unit=99:1

Also, when the molar ratio is 1:99, it means a case where the following proportional expression is established.

Second (meth)acrylate repeating unit: Third (meth)acrylate repeating unit=1:99

As such, as the photo-curable and thermo-curable copolymer contains both the first (meth)acrylate repeating unit and the second (meth)acrylate repeating unit, not only the low-temperature thermal curability and the development property but also the alkali solubility can be further improved.

Further, the molar ratio between the first (meth)acrylate repeating unit and the third (meth)acrylate repeating unit is 99:1 to 1:19, or 99:1 to 1:10, or 99:1 to 1:5, or 5:1 to 1:5, or 4:1 to 1:3. The molar ratio of 99:1 to 1:19 means a molar ratio between the first (meth)acrylate repeating unit and the third (meth)acrylate repeating unit. Specifically, when the molar ratio is 99:1, it means a case where the following proportional expression is established.

First (meth)acrylate repeating unit: Third (meth)acrylate repeating unit=99:1

Also, when the molar ratio is 1:19, it means a case where that the following proportional expression is established.

First (meth)acrylate repeating unit: Third (meth)acrylate repeating unit=1:19

As such, as the photo-curable and thermo-curable copolymer contains both the first (meth)acrylate repeating unit and the third (meth)acrylate repeating unit, not only the low-temperature thermal curability and the development property but also the alkali solubility can be further improved.

Meanwhile, the photo-curable and thermo-curable copolymer may further include one or more repeating units selected from the group consisting of a fourth (meth)acrylate repeating unit represented by the following Chemical Formula 8; a maleimide repeating unit represented by the following Chemical Formula 9; and a vinyl repeating unit represented by the following Chemical Formula 10. Thereby, the heat resistance and chemical resistance of the photo-curable and thermo-curable copolymer may be improved.

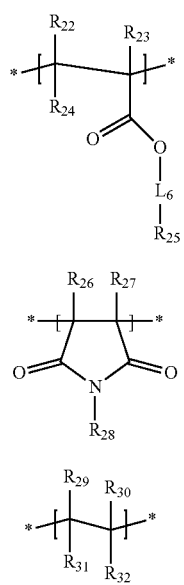

[Chemical Formula 8]

[Chemical Formula 9]

[Chemical Formula 10]

In the Chemical Formulas 8 to 10, $R_{22}$ to $R_{32}$ are each independently any one functional group of: hydrogen; deuterium; a halogen group; an alkyl group having 1 to 20 carbon atoms; an alkoxy group having 1 to 20 carbon atoms; a monocyclic or polycyclic aryl group having 6 to 30 carbon atoms; an alkenyl group having 2 to 20 carbon atoms; or a monocyclic or polycyclic cycloalkyl group having 3 to 30 carbon atoms, and $L_6$ is any functional group of: a direct bond, an alkylene group having 1 to 20 carbon atoms, or an oxyalkylene group having 1 to 20 carbon atoms.

As a more specific example, in the fourth (meth)acrylate repeating unit represented by Chemical Formula 8, $R_{22}$ and $R_{24}$ may be hydrogen, $R_{23}$ may be a methyl group, $L_6$ may be a methylene group, and $R_{25}$ may be a phenyl group. That is, the fourth (meth)acrylate repeating unit may be a repeating unit derived from benzyl methacrylate.

Further, in the maleimide repeating unit represented by Chemical Formula 9, $R_{26}$ and $R_{27}$ may be hydrogen, and $R_{28}$ may be a phenyl group. In the vinyl repeating unit represented by Chemical Formula 10, $R_{29}$, $R_{30}$ and $R_{31}$ may be hydrogen, and $R_{32}$ may be a phenyl group. That is, the maleimide repeating unit represented by Chemical Formula 9 may be a repeating unit derived from N-phenylmaleimide, and the vinyl repeating unit represented by Chemical Formula 10 may be a repeating unit derived from styrene.

The molar ratio between the fourth (meth)acrylate repeating unit and the first (meth)acrylate repeating unit is 1:99 to 99:1, and the molar ratio between the fourth (meth)acrylate repeating unit and the second (meth)acrylate repeating unit may be 1:99 to 99:1. In this manner, the first (meth)acrylate repeating unit, the second (meth)acrylate repeating unit, and the fourth (meth)acrylate repeating unit are mixed and used together, thereby realizing a technical effect of improving heat resistance and chemical resistance.

The weight average molecular weight (measured by GPC) of the photo-curable and thermo-curable copolymer may be 1000 g/mol to 100000 g/mol, or 1000 g/mol to 10000 g/mol, or 5000 g/mol to 7000 g/mol.

Further, the acid value (Av) of the photo-curable and thermo-curable copolymer may be 20 KOH mg/g to 150 KOH mg/g, or 20 KOH mg/g to 60 KOH mg/g, or 30 KOH mg/g to 60 KOH mg/g, or 40 KOH mg/g to 55 KOH mg/g, or 42 KOH mg/g to 54 KOH mg/g, or 20 KOH mg/g to 50 KOH mg/g, or 50 KOH mg/g to 60 KOH mg/g. Thereby, the photo-curable and thermo-curable copolymer has high alkali solubility and thus can realize excellent development property.

In the above, the acid value means the number of mg of potassium hydroxide required to neutralize free fatty acids or resin acids contained in 1 g of the sample. Examples of the method for measuring the acid value are not particularly limited, but for example, the acid value was measured using an automatic titrator (Hiranuma Sangyo Co., Ltd., COM-550), and was determined by the following equation.

$$A=\{(Y-X) \times f \times 5.611\}/M$$

A; the acid value, Y; the titration volume of sample solution (ml), X; the titration volume of solution containing only 50 g of mixed solvent (ml), f; the factor of titration solution, and M; the weight of polymer sample (g)

Examples of the measurement conditions of the acid value are as follows.

Sample solution: about 0.5 g of an adhesive polymer sample was dissolved in 50 g of a mixed solvent (toluene/2-propanol/distilled water=50/49.5/0.5, weight ratio) to prepare a sample solution.

Titration solution: 0.1N, 2-propanol potassium hydroxide solution (for Wako Pure Chemical Industries, Ltd., for neutralization value test of petroleum products)

Electrode: glass electrode; GE-101, reference electrode; RE-201

Measurement mode: neutralization value test of petroleum products 1

Examples of the method for synthesizing the photo-curable and thermo-curable copolymer are not particularly limited, but for example, it can be prepared by the method for preparing the photo-curable and thermo-curable copolymer comprising: a first step of polymerizing a monomer mixture containing a (meth)acrylate monomer in which an organic functional group including an epoxy group is substituted at the terminal end; a second step of reacting the resultant reaction product of the first step with a compound containing an organic functional group including an alkenyl group; and a third step of reacting the resultant reaction product of the second step with an acid anhydride compound. Examples of the (meth)acrylate monomer in which the organic functional group including the epoxy group is substituted at the terminal include glycidyl methacrylate, or 3,4-epoxycyclohexylmethyl methacrylate, or the following Chemical Formula 4-3 derived from Chemical Formula A of Synthesis Example 3 below, the following Chemical Formula 4-4 derived from Chemical Formula B of Synthesis Example 4 below, and the like, and examples of the compound containing an organic functional group including the alkenyl group include methacrylic acid. Examples of the acid anhydride compound include one or more selected from the group consisting of succinic anhydride, phthalic anhydride, trans-1,2-cyclohexanedicarboxylic anhydride, cis-1,2-cyclohexanedicarboxylic anhydride, hexahydro-4-methylphthalic anhydride and 1,2,3,6-tetrahydrophthalic anhydride. Further, benzyl methacrylate, N-phenylmaleimide, and styrene may be added to the monomer mixture as other monomers used for the synthesis of the copolymer.

II. Photosensitive Resin Composition

According to another embodiment of the present invention, a photosensitive resin composition comprising: the alkali soluble, photo-curable and thermo-curable copolymer of one embodiment; a photopolymerizable monomer having two or more photocurable unsaturated functional groups; and a photo-initiator can be provided.

The details of the alkali soluble, photo-curable and thermo-curable copolymer include all the contents described above in one embodiment.

Such a photopolymerizable monomer may be, for example, a compound having two or more photo-curable unsaturated functional groups such as polyfunctional vinyl group and the like, and it may form a cross-linked bond with the unsaturated functional group of the above-mentioned photo-curable and thermo-curable copolymer to form a cross-linked structure by photo-curing when exposed to light. Therefore, the photosensitive resin composition of the exposure part may not be alkali-developed during the formation of a pattern film described later but may remain on the substrate.

The photopolymerizable monomer which is in a liquid phase at room temperature may be used, and therefore, may serve to control viscosity of the photosensitive resin composition in compliance with a coating method, or to more improve the alkaline development property of a non-exposure part.

As the photopolymerizable monomer, an acrylate-based compound having two or more photo-curable unsaturated functional groups may be used. More specific examples include one or more compounds selected from the group consisting of a hydroxyl group-containing acrylate-based compound such as 2-hydroxyethyl acrylate, 2-hydroxypropyl acrylate, pentaerythritol triacrylate, dipentaerythritol pentaacrylate, etc.; a water-soluble acrylate-based compound such as polyethylene glycol diacrylate, polypropylene glycol diacrylate, etc.; a polyfunctional polyesteracrylate-based compound of a polyhydric alcohol such as trimethylolpropane triacrylate, pentaerythritol tetraacrylate, dipentaerythritol hexaacrylate, etc.; an acrylate-based compound of an ethylene oxide adduct and/or a propylene oxide adduct of a polyfunctional alcohol such as trimethylol propane, hydrogenated bisphenol A, etc., or a polyphenol such as bisphenol A, biphenol, etc.; a polyfunctional or monofunctional polyurethane acrylate-based compound which is an isocyanate adduct of the hydroxyl group-containing acrylate-based compound; an epoxyacrylate-based compound which is a (meth)acrylic acid adduct of bisphenol A diglycidylether, hydrogenated bisphenol A diglycidylether, or phenol novolac epoxy resin; a caprolactone-modified acrylate-based compound such as caprolactone-modified ditrimethylolpropane tetraacrylate, an acrylate of F-caprolactone-modified dipentaerythritol, a caprolactone-modified hydroxyl pivalic acid neopentylglycolester diacrylate, etc.; and a photosensitive (meth)acrylate-based compound of a (meth)acrylate-based compound corresponding to the above-described acrylate-based compounds, and they may be used alone or in combination of two or more thereof.

Among them, as the photopolymerizable monomer, a polyfunctional (meth)acrylate-based compound having two or more (meth)acryloyl groups in a molecule may be preferably used. In particular, pentaerythritol triacrylate, trimethylolpropane triacrylate, dipentaerythritol hexaacrylate, caprolactone-modified ditrimethylolpropane tetraacrylate, or the like may be appropriately used. Examples of a commercially available photopolymerizable monomer include DPEA-12, etc.

The photopolymerizable monomer may be included in an amount of 0.1 to 30% by weight, or 1 to 20% by weight, based on the total weight of the photosensitive resin composition. If the content of the photopolymerizable monomer is too low, the photo-curing may be insufficient, and if the content is too high, the drying property of the cured film may be deteriorated, and physical properties may be reduced.

Meanwhile, the photo-initiator, for example, plays a role of initiating a radical photo-curing between the photo-curable and thermo-curable copolymer and photopolymerizable monomer at the light exposed part of the photosensitive resin composition.

As the photo-initiator, any known material can be used, and for example, a benzoin-based compound such as benzoin, benzoinmethylether, benzoinethylether, and the like and an alkylester thereof; an acetophenone-based compound such as acetophenone, 2,2-dimethoxy-2-phenylacetophenone, 1,1-dichloroacetophenone, 4-(1-t-butyldioxy-1-methylethyl)acetophenone, and the like; an anthraquinone-based compound such as 2-methylanthraquinone, 2-amylanthraquinone, 2-t-butylanthraquinone, 1-chloroanthraquinone, and the like; a thioxanthone-based compound such as 2,4-dimethylthioxanthone, 2,4-diisopropylthioxanthone, 2-chlorothioxanthone, and the like; a ketal-based compound such as acetophenonedimethylketal, benzyldimethylketal, and the like; and a benzophenone-based compound such as benzophenone, 4-(1-t-butyldioxy-1-methylethyl)benzophenone, 3,3',4,4'-tetrakis(t-butyldioxycarbonyl) benzophenone, and the like may be used.

Further, an α-amino acetophenone-based compound such as 2-methyl-1-[4-(methylthio)phenyl]-2-morpholinopropanone-1,2-benzyl-2-dimethylamino-1-(4-morpholinophenyl)-butane-1-on, 2-(dimethylamino)-2-[(4-methylphenyl) methyl]-1-[4-(4-morpholinyl)phenyl]-1-butanone, N,N-dimethylaminoacetophenone (as commercially available products, Irgacure (registered trade mark) 907, Irgacure 369, Irgacure 379, etc.), commercially available from Chiba Specialty Chemicals Co., Ltd. (present Chiba Japan Co., Ltd.); and an acylphosphineoxide-based compound such as 2,4,6-trimethylbenzoyldiphenylphosphineoxide, bis(2,4,6-trimethylbenzoyl)-phenylphosphineoxide, bis(2,6-dimethoxybenzoyl)-2,4,4-trimethyl-pentylphosphineoxide (as commercially available products, Lucirin (registered trade mark) TPO commercially available from BASF Co., Ltd., Irgacure 819 commercially available from Chiba Specialty Chemicals Co., Ltd.) may be mentioned as a preferable photo-initiator.

Furthermore, as other preferable photo-initiator, an oximeester-based compound may be included. Specific examples of the oximeester-based compound include 2-(acetyloxyiminomethyl)thioxanthene-9-on, (1,2-octanedion, 1-[4-(phenylthio)phenyl]-,2-(O-benzoyloxime)), (ethanone,1-[9-ethyl-6-(2-methylbenzoyl)-9H-carbazole-3-yl]-,1-(O-acetyloxime)), and the like. As commercially available products, GGI-325, Irgacure OXE01, and Irgacure OXE02 from Chiba Specialty Chemicals Co., Ltd., N-1919 from ADEKA Co., Ltd., and Darocur TPO commercially available from Chiba Specialty Chemicals Co., Ltd. may be included.

The content of the photo-initiator may be 0.1 to 20% by weight, or 1 to 10% by weight based on the total weight of the resin composition. If the content of the photo-initiator is too low, the photo-curing may not occur properly, and conversely, if the content is too high, the resolution of the resin composition may be deteriorated or the pattern film may have insufficient reliability.

Meanwhile, the photosensitive resin composition may further include one or more selected from the group consisting of a solvent; and a filler, a pigment and an additive.

The filler added as above plays a role of improving the heat-resistant stability, the dimensional stability to heat, and the adhesive force of the resin. It also acts as a body pigment by reinforcing the color. As the filler, inorganic or organic fillers may be used, and for example barium sulfate, barium titanate, amorphous silica, crystalline silica, fused silica, spherical silica, talc, clay, magnesium carbonate, calcium carbonate, aluminum oxide (alumina), aluminum hydroxide, mica, and the like may be used.

The pigment exhibits visibility and hiding power. As the pigment, red, blue, green, yellow, and black pigments may be used. As the blue pigment, phthalocyanine blue, pigment blue 15:1, pigment blue 15:2, pigment blue 15:3, pigment blue 15:4, pigment blue 15:6, pigment blue 60, and the like may be used. As the green pigment, pigment green 7, pigment green 36, solvent green 3, solvent green 5, solvent green 20, solvent green 28, and the like may be used. As the yellow pigment, anthraquinone-based compounds, isoindolinone-based compounds, condensed azo-based compounds, benzimidazolone-based compounds, and the like may be used, and for example, pigment yellow 108, pigment yellow 147, pigment yellow 151, pigment yellow 166, pigment yellow 181, pigment yellow 193, and the like may be used. As the red pigment, pigment red 254, and the like may be used.

The content of the pigment is preferably used in an amount of 0.1 to 10% by weight, or 0.5 to 5% by weight based on the total weight of the resin composition.

The additive may be included for eliminating bubbles in the resin composition, eliminating popping or craters on the surface during a film coating process, imparting a flame retardant property, controlling viscosity, or playing a role of a catalyst.

Specifically, a well-known additive including a well-known thickener such as micronized silica, organic bentonite, montmorillonite, and the like; a silicon-based, fluoro-based, or polymer-based antifoaming agent and/or leveling agent; an imidazole-based, thiazole-based, or triazole-based silane coupling agent; a flame retardant such as a phosphorus-based flame retardant, an antimony-based flame retardant, and the like may be included therein.

Among them, the leveling agent plays a role of eliminating popping or craters on the surface during film coating process, and for example, BYK-380N, BYK-307, BYK-378, BYK-350, and the like produced by BYK-Chemie GmbH may be used.

The content of the additive is preferably 0.01 to 10% by weight based on the total weight of the resin composition.

The solvent may be used by mixing one or more solvents together in order to dissolve the resin composition or impart proper viscosity.

As the solvent, ketones such as methylethylketone, cyclohexanone, and the like; aromatic hydrocarbons such as toluene, xylene, tetramethylbenzene, and the like; glycol ethers (cellosolves) such as ethyleneglycol monoethylether, ethyleneglycol monomethylether, ethyleneglycol monobutylether, diethyleneglycol monoethylether, diethyleneglycol monomethylether, diethyleneglycol monobutylether, propyleneglycol monomethylether, propyleneglycol monoethylether, dipropyleneglycol diethylether, triethyleneglycol monoethylether, and the like; acetic acid esters such as ethyl acetate, butyl acetate, ethyleneglycol monoethylether acetate, ethyleneglycol monobutylether acetate, diethyleneglycol monoethylether acetate, diethyleneglycol monobutylether acetate, propyleneglycol monomethylether acetate, dipropyleneglycol monomethylether acetate, and the like; alcohols such as ethanol, propanol, ethylene glycol, propylene glycol, carbitol, and the like; aliphatic hydrocarbons such as octane, decane, and the like; petroleum-based solvents such as petroleum ether, petroleum naphtha, hydrogenated petroleum naphtha, solvent naphtha, and the like; and amides such as dimethyl acetamide, dimethylformamide (DMF), and the like may be used. These solvents may be used alone or in a mixture of two or more thereof.

The content of the solvent may be 5 to 50% by weight based on the total weight of the resin composition. When the content is less than 5% by weight, the viscosity may be too high and thus the coating property may decrease, and when the content exceeds 50% by weight, the drying may not be performed properly and the tackiness may increase.

In addition, the photosensitive resin composition may further include an acid-modified oligomer or a thermal-curable binder, if necessary. As specific examples of the acid-modified oligomer and the thermal-curable binder, various kinds of compounds, oligomers, or polymers widely known in the field of the photosensitive resin composition can be applied without limitation.

III. Photosensitive Resin Film

According to another embodiment of the present invention, a photosensitive resin film comprising a cured product of the photosensitive resin composition of another embodiment of the present invention can be provided. More specifically, the cured product of the photosensitive resin composition of another embodiment may include a cured product between the photo-curable and thermo-curable copolymer of one embodiment; and a photopolymerizable monomer having two or more photocurable unsaturated functional groups.

The photosensitive resin film may be a single film that does not include a pattern, or may include a pattern film including a pattern through exposure/development.

The photosensitive resin film can be prepared by a method for preparing a photosensitive resin film comprising the steps of: 1) coating the photosensitive resin composition of another embodiment onto a substrate to form a coating film; 2) drying the coating film; 3) irradiating the dried coating film with light to perform photo-curing; and 4) thermally curing the photo-cured coating film at 50° C. to 250° C.

In the step of coating the photosensitive resin composition of another embodiment onto a substrate to form a coating film (step 1), the photosensitive resin composition includes all the contents described above in another embodiment.

The method of coating the photosensitive resin composition onto a substrate is not particularly limited, and for example, a method such as screen printing, offset printing, flexographic printing, inkjet, and the like can be used.

Further, the photosensitive resin composition may be one in which the photo-curable and thermo-curable copolymer of one embodiment; a photopolymerizable monomer having two or more photocurable unsaturated functional groups; and a photo-initiator are dissolved or dispersed in an organic solvent.

The step of drying the coating film (step 2) is for removing a solvent or the like used in the photosensitive resin composition, and for example, a method such as heating or vacuum evaporation of the coating film may be used. The drying is preferably performed at a temperature of 50° C. to 130° C., more preferably 70° C. to 120° C.

The step of irradiating the dried coating film with light to perform photo-curing (step 3) is a step of irradiating the coating film dried in step 2 with light to perform curing treatment. As described above, the organic functional group including an alkenyl group inside the second (meth)acrylate repeating unit included in the photo-curable and thermo-curable copolymer of one embodiment can be photo-cured under light irradiation to form a cured structure.

In the step of irradiating the film with light to performing curing, it is exposed to light (UV, etc.) having a certain wavelength band. The exposure process may be selectively exposed through a photomask, or through direct pattern exposure using a direct laser exposer. The amount of exposure may vary depending on the thickness of the coating film, but may preferably be 0.1 mJ/cm$^2$ to 1,000 mJ/cm$^2$.

Subsequent to the step of irradiating the dried coating film with light to perform photo-curing (step 3), a development step is carried out by using an alkali solution. As the alkali solution, an aqueous alkali solution including potassium hydroxide, sodium hydroxide, sodium carbonate, potassium carbonate, sodium phosphate, sodium silicate, ammonia, amines, etc. may be used. Due to such development, only the light exposed part of the film can remain.

That is, when the exposure is performed, for example, photo-curing can occur in the exposed part and a cross-linked bond can be formed between a copolymer having photo-curable and thermo-curable properties and the unsaturated functional groups contained in a photopolymerizable monomer, etc. As a result, it may become a state that is not removed by a subsequent development.

The step of thermally curing the photo-cured coating film at 50° C. to 250° C. (step 4) is a step of subjecting the coating film photo-cured in step 3 to a low-temperature heat treatment. The temperature of the low-temperature heat treatment is preferably 200° C. or less. Preferably, the temperature of the low-temperature heat treatment is 50° C. to 250° C., more preferably 70° C. to 150° C., or 80° C. to 120° C. In this case, the heat treatment means, is not particularly limited and can be performed by a heating means such as a hot plate, a hot-air circulation furnace, an infrared furnace and the like As described above, the organic functional group including the epoxy group inside the first (meth)acrylate repeating unit included in the photo-curable and thermo-curable copolymer of one embodiment can be subjected to thermal curing by heat treatment to form a cured structure.

Through the above-mentioned method and the like, as the photosensitive resin film is subjected to photo-curing and thermal-curing, it may include a cured product between the photo-curable and thermo-curable copolymer of one embodiment; and the photopolymerizable monomers having two or more photocurable unsaturated functional groups. More specifically, the cured product may include a cross-linked structure in which the epoxy group of the photo-curable and thermo-curable copolymer and the thermal-curable functional group are crosslinked by thermal curing; and a crosslinked structure in which the alkenyl group of the photo-curable and thermo-curable copolymer and the unsaturated functional group of the photopolymerizable monomer are crosslinked to each other by photocuring.

In addition, the photosensitive resin film may further include a small quantity of the photo-initiator or optionally added pigments or additives remain after the photo-curing process in a state of being dispersed in the cured product.

The thickness of the photosensitive resin film is not particularly limited, but for example, it can be freely adjusted within a range of 0.01 μm to 1000 μm. When the thickness of the photosensitive resin film increases or decreases by a specific value, the physical properties measured in the photosensitive resin film may also change by a certain value.

IV. Color Filter

According to another embodiment of the present invention, a color filter including the photosensitive resin film of another embodiment may be provided.

The details of the photosensitive resin film may include all the contents described above in the other embodiments. The photosensitive resin film used for the color filter may include a pigment in a dispersed state in a cured product.

In addition, for details concerning other color filters, various technical configurations widely known in the field of color filters can be applied without limitation.

Advantageous Effects

According to the present invention, there can be provided an alkali soluble, photo-curable and thermo-curable copolymer which has excellent thermal curability at relatively low temperature, can also be photo-cured by light irradiation, can have enhanced curing degree and thus excellent durability and chemical resistance, and has increased alkali solubility and thus improved development property, and a photosensitive resin composition, a photosensitive resin film and a color filter using the same.

BRIEF DESCRIPTION OF THE DRAWINGS

FIG. 1 shows the results of observation of the chemical resistance in Experimental Example 2 of Examples 1, 2, 3, 4, and 5.

FIG. 2 shows the results of observation of the chemical resistance in Experimental Example 2 of Example 6.

FIG. 3 shows the results of observation of the chemical resistance in Experimental Example 2 of Comparative Examples 1, 2, and 3.

FIG. 4 shows the results of observation of the chemical resistance in Experimental Example 2 of Reference Example 1.

DETAILED DESCRIPTION OF THE EMBODIMENTS

Hereinafter, the present invention will be described in more detail with reference to Examples. However, the Examples are only for illustrative purposes, and the scope of the present invention is not intended to be limited by these Examples.

Synthesis Example: Synthesis of Alkali Soluble, Photo-Curable and Thermo-Curable Copolymer Synthesis Example 1

To a reaction vessel, 4.8 wt % of benzyl methacrylate, 0.8 wt % of N-phenylmaleimide, 0.6 wt % of styrene, and 12.3 wt % of glycidyl methacrylate were added and dissolved together with 75.0 wt % of propylene glycol methyl ether acetate (PGMEA) as the solvent, and then the temperature was raised to 75° C. under a nitrogen atmosphere. When the reaction temperature reached 75° C., 1.2 wt % of thermal initiator V-65 was added and then reacted for 12 hours.

After the thermal polymerization inhibitor and the catalyst were added to the resin solution thus obtained, 2.2 wt % of methacrylic acid was added under an air atmosphere and reacted for 16 hours while maintaining 120° C.

Subsequently, the temperature of the resin solution was lowered to 80° C., 2.0 wt % of succinic anhydride was added thereto, and the mixture was further stirred at 80° C. for 24 hours to prepare an alkali soluble, photo-curable and thermo-curable copolymer (Mw: 6260 g/mol, Av: 42 KOHmg/g).

In the copolymer, the content of the first (meth)acrylate repeating unit represented by the following Chemical Formula 11 was 49 mol % of the total copolymer, the content of the second (meth)acrylate repeating unit represented by the following Chemical Formula 12 was 5.3 mol % of the total copolymer, and the content of the third (meth)acrylate repeating unit represented by the following Chemical Formula 13 was 15.8 mol % of the total copolymer.

[Chemical Formula 11]

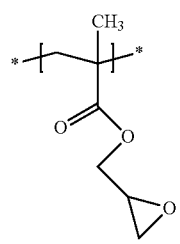

[Chemical Formula 12]

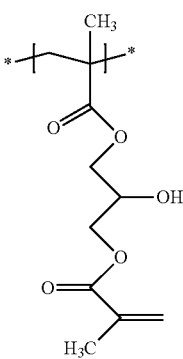

[Chemical Formula 13]

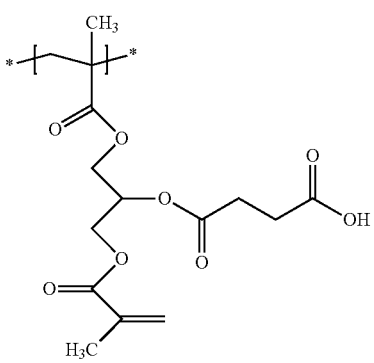

Synthesis Example 2

An alkali soluble, photo-curable and thermo-curable copolymer was synthesized in the same manner as in Synthesis Example 1, except that 3,4-epoxycyclohexylmethyl-methacrylate was used instead of glycidyl methacrylate.

Synthesis Example 3

An alkali soluble, photo-curable and thermo-curable copolymer was synthesized in the same manner as in Synthesis Example 1, except that a compound represented by the following Chemical Formula A was used instead of glycidyl methacrylate.

[Chemical Formula A]

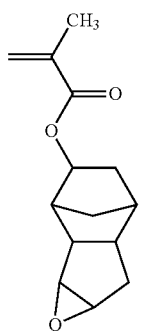

Synthesis Example 4

An alkali soluble, photo-curable and thermo-curable copolymer was synthesized in the same manner as in Synthesis Example 1, except that a compound represented by the following Chemical Formula B was used instead of glycidyl methacrylate.

[Chemical Formula B]

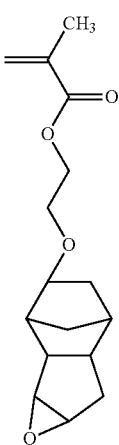

Synthesis Example 5

An alkali soluble, photo-curable and thermo-curable copolymer was synthesized in the same manner as in Synthesis Example 1, except that 3.0 wt % of 1,2,5,6-tetrahydrophthalic anhydride was used instead of 2.0 wt % of succinic anhydride.

Synthesis Example 6

To a reaction vessel, 9.0 wt % of benzyl methacrylate, 1.5 wt % of N-phenylmaleimide, 1.1 wt % of styrene, and 6.6 wt % of glycidyl methacrylate were added and dissolved together with 74.0 wt % of propylene glycol methyl ether acetate (PGMEA) as the solvent, and then the temperature was raised to 75° C. under a nitrogen atmosphere. When the reaction temperature reached 75° C., 1.0 wt % of thermal initiator V-65 was added thereto and then reacted for 12 hours.

After the thermal polymerization inhibitor and the catalyst were added to the resin solution thus obtained, 3.0 wt % of methacrylic acid was added under an air atmosphere and reacted for 16 hours while maintaining 120° C.

Subsequently, the temperature of the resin solution was lowered to 80° C., 2.6 wt % of succinic anhydride was added thereto, and the mixture was further stirred at 80° C. for 24 hours to prepare an alkali soluble, photo-curable and thermo-curable copolymer (Mw: 5,070 g/mol, Av: 54 KOHmg/g).

In the copolymer, the content of the first (meth)acrylate repeating unit represented by Chemical Formula 11 was 10 mol % of the total copolymer, the content of the second (meth)acrylate repeating unit represented by Chemical Formula 12 was 7.5 mol % of the total copolymer, and the content of the third (meth)acrylate repeating unit represented by Chemical Formula 13 was 22.5 mol % of the total copolymer.

Comparative Synthesis Example

Comparative Synthesis Example 1

To a reaction vessel, 8.6 wt % of benzyl methacrylate, 1.4 wt % of N-phenylmaleimide, 1.0 wt % of styrene, and 6.3 wt % of glycidyl methacrylate were added and dissolved together with 71.4 wt % of propylene glycol methyl ether acetate (PGMEA) as the solvent, and then the temperature was raised to 65° C. under a nitrogen atmosphere. When the reaction temperature reached 65° C., 1.0 wt % of thermal initiator V-65 was added thereto and then reacted for 12 hours.

After the thermal polymerization inhibitor and the catalyst were added to the resin solution thus obtained, 4.0 wt % of methacrylic acid was added under an air atmosphere and reacted for 16 hours while maintaining 120° C.

The temperature of the prepared resin solution was lowered to 90° C., 5.1 wt % of 1,2,5,6-tetrahydrophthalic anhydride was added under an air atmosphere and reacted for 24 hours. The weight average molecular weight of the prepared copolymer was 5,440 g/mol, the acid value was 70 KOH mg/g, the content of the first (meth)acrylate repeating unit represented by Chemical Formula 11 was 0 mol % of the total copolymer, the content of the second (meth)acrylate repeating unit represented by Chemical Formula 12 was 2.0 mol % of the total copolymer, and the content of the third (meth)acrylate repeating unit was 38.0 mol % of the total copolymer.

Comparative Synthesis Example 2

68 g of benzyl methacrylate, 11 g of N-phenyl maleimide, 8 g of styrene, 32 g of glycidyl methacrylate, 4 g of 1-dodecanthiol as the chain transfer agent, and 480 g of propylene glycol monomethyl ether acetate (PGMEA) as the solvent were mixed using a mechanical stirrer under a nitrogen atmosphere for 30 minutes. When the temperature of the reactor was increased to 60° C. under a nitrogen atmosphere and the temperature of the mixture reached 60° C., 5 g of a V-65 solution as the thermal polymerization initiator was added and stirred for 15 hours.

The temperature of the reactor which has polymerized the polymer was raised to 80° C., 0.5 g of tetraethylammonium bromide and 0.1 g of 4-methoxy phenol as the thermal polymerization inhibitor were added and stirred under an air atmosphere for 3 hours, and then 18 g of acrylic acid was added. The temperature of the reactor was raised to 100° C. and the reaction mixture was stirred for 24 hours.

The temperature of the prepared polymer solution was lowered to 70° C., 27 g of 1,2,5,6-tetrahydrophthalic anhydride was added, and further stirred at 80° C. for 24 hours to synthesize a copolymer. (Mw: 20,000 g/mol, Av: 80 KOH mg/g).

In the copolymer, the content of the first (meth)acrylate repeating unit represented by Chemical Formula 11 was 0 mol % of the total copolymer, the content of the second (meth)acrylate repeating unit represented by Chemical Formula 12 was 6.3 mol % of the total copolymer, and the content of the third (meth)acrylate repeating unit represented by Chemical Formula 13 was 23.6 mol % of the total copolymer.

Reference Synthesis Example

Reference Synthesis Example 1

68 g of benzyl methacrylate, 11 g of N-phenyl maleimide, 8 g of styrene, 32 g of glycidyl methacrylate, 4 g of 1-dodecanthiol as the chain transfer agent, and 480 g of propylene glycol monomethyl ether acetate (PGMEA) as the solvent were mixed using a mechanical stirrer under a nitrogen atmosphere for 30 minutes. When the temperature of the reactor was raised to 60° C. under a nitrogen atmosphere and the temperature of the mixture reached 60° C., 5 g of a V-65 solution as a thermal polymerization initiator was added thereto and stirred for 15 hours.

The temperature of the reactor which has polymerized the polymer was raised to 80° C., 0.5 g of tetraethylammonium bromide and 0.1 g of 4-methoxy phenol as a thermal polymerization inhibitor were added and stirred under an air atmosphere for 3 hours, and then 18 g of acrylic acid was added. The temperature of the reactor was raised to 100° C. and the reaction mixture was stirred for 24 hours.

The temperature of the prepared polymer solution was lowered to 70° C., 20 g of succinic anhydride was added, and further stirred at 80° C. for 24 hours to synthesize a copolymer. (Mw: 22,000 g/mol, Av: 80 KOH mg/g).

In the copolymer, the content of the first (meth)acrylate repeating unit represented by Chemical Formula 11 was 2.1 mol % of the total copolymer, the content of the second (meth)acrylate repeating unit represented by Chemical Formula 12 was 1.2 mol % of the total copolymer, and the content of the third (meth)acrylate repeating unit represented by Chemical Formula 13 was 26.6 mol % of the total copolymer.

Example and Comparative Example: Preparation of Photosensitive Resin Composition and Photosensitive Resin Pattern Film Example 1

(1) Photosensitive Resin Composition 1 g of Irgacure 369 (manufactured by Ciba Specialty Chemicals) as the photopolymerization initiator was added to 35 g of propylene glycol methyl ether acetate (PGMEA) as the solvent, and the mixture was stirred and dissolved at room temperature for 30 minutes, and then 7.5 g of the copolymer obtained in Synthesis Example 1, and 5 g of dipentaerythritol penta/hexa acrylate (DPHA, manufactured by Nippon Kayaku) as the crosslinkable monomer having an ethylene-based double bond were added thereto, and stirred at room temperature for 1 hour. As the pigment, 50 g of C.I. Pigment Red 254 15% dispersion liquid and 0.2 g of the additive were added, and then stirred at room temperature for 1 hour. The composition obtained by the reaction was filtered twice or more to remove impurities, thereby preparing a photosensitive resin composition.

(2) Photosensitive Resin Pattern Film

The photosensitive resin composition was coated on a 5 cm×5 cm glass at 230 rpm and pre-baked at 100° C. for 100 seconds. Thereafter, exposure was performed at an energy of 40 mJ/cm$^2$, developed, and then post-baked at 100° C. for 30 minutes to prepare a photosensitive resin pattern film.

Example 2

A photosensitive resin composition and a photosensitive resin film were prepared in the same manner as in Example 1, except that during the preparation of the photosensitive resin composition, the copolymer obtained in Synthesis Example 2 was used instead of the copolymer obtained in Synthesis Example 1.

Example 3

A photosensitive resin composition and a photosensitive resin film were prepared in the same manner as in Example 1, except that during the preparation of the photosensitive resin composition, the copolymer obtained in Synthesis Example 3 was used instead of the copolymer obtained in Synthesis Example 1.

Example 4

A photosensitive resin composition and a photosensitive resin film were prepared in the same manner as in Example 1, except that during the preparation of the photosensitive resin composition, the copolymer obtained in Synthesis Example 4 was used instead of the copolymer obtained in Synthesis Example 1.

Example 5

A photosensitive resin composition and a photosensitive resin film were prepared in the same manner as in Example 1, except that during the preparation of the photosensitive resin composition, the copolymer obtained in Synthesis Example 5 was used instead of the copolymer obtained in Synthesis Example 1.

Example 6

A photosensitive resin composition and a photosensitive resin film were prepared in the same manner as in Example 1, except that during the preparation of the photosensitive resin composition, the copolymer obtained in Synthesis Example 6 was used instead of the copolymer obtained in Synthesis Example 1.

Comparative Example 1

A photosensitive resin composition and a photosensitive resin film were prepared in the same manner as in Example 1, except that during the preparation of the photosensitive resin composition, the thermal-curable resin represented by the following Chemical Formula C (bisphenol-based novolac epoxy resin; KBPN-110 from Kukdo Chemical) was used instead of the copolymer obtained in Synthesis Example 1.

[Chemical Formula C]

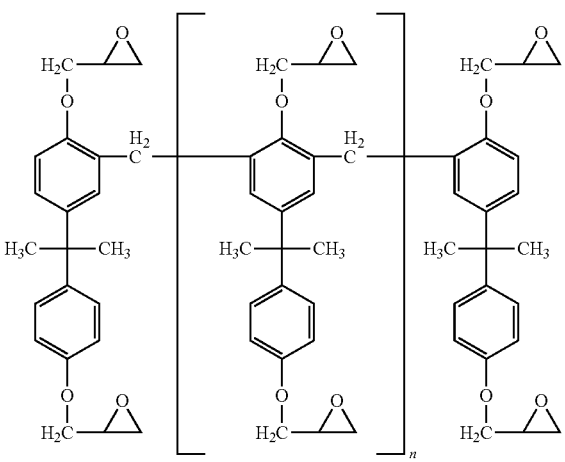

Comparative Example 2

A photosensitive resin composition and a photosensitive resin film were prepared in the same manner as in Example 1, except that during the preparation of the photosensitive resin composition, the copolymer obtained in Comparative Synthesis Example 1 was used instead of the copolymer obtained in Synthesis Example 1.

Comparative Example 3

A photosensitive resin composition and a photosensitive resin film were prepared in the same manner as in Example 1, except that during the preparation of the photosensitive resin composition, the copolymer obtained in Comparative Synthesis Example 2 was used instead of the copolymer obtained in Synthesis Example 1.

Reference Example 1

A photosensitive resin composition and a photosensitive resin film were prepared in the same manner as in Example 1, except that during the preparation of the photosensitive resin composition, the copolymer obtained in Reference Synthesis Example 1 was used instead of the copolymer obtained in Synthesis Example 1.

Experimental Example: Measurement of Physical Properties of Photosensitive Resin Composition and Photosensitive Resin Pattern Film Obtained in Examples and Comparative Examples The physical properties of the photosensitive resin compositions and the photosensitive resin pattern films obtained in the Examples and Comparative Examples were measured by the following methods, and the results are shown in Table below.

1. Experimental Example 1: Migration Properties

The photosensitive resin compositions containing pigments having different colors from the pigment contained in the photosensitive resin pattern films were coated/developed on the photosensitive resin pattern films obtained in the Examples and Comparative Examples, and then the color change of the photosensitive resin pattern films was determined by MPCD (Minimum Perceptable Color Difference). Whether or not the pigment was eluted was evaluated based on the following criteria, and the results are shown in Table 2 below.
  ○: Pigment is not eluted at all
  Δ: Slight elution of pigment is observed
  X: Film is peeled off at the same time as elution of pigment 2. Experimental Example 2: Chemical Resistance The overcoat photosensitive solution was coated/exposed/cured on the photosensitive resin pattern films obtained in the Examples and Comparative Examples, and then the color change of the photosensitive resin pattern films was determined by MPCD (Minimum Perceptable Color Difference). The pattern movement and swelling were observed using an optical equipment, and the results are shown in Table 1 below. Whether or not the pigment was eluted was evaluated based on the following criteria, and the results are shown in Table 2 below.
  ○: Pigment is not eluted at all
  Δ: Slight elution of pigment is observed
  X: The film is peeled off at the same time as elution of pigment 3. Experimental Example 3: Development Property For the evaluation of development property, the photosensitive composition solution was spin coated on a glass or BM glass, and then pre-baked at 100° C. for 100 seconds to form a film. A mask having pattern was applied to the film thus formed, and the UV of the i-line was exposed to 40 mJ. The exposed film was put in a developer, and the time when the pattern starts to appear while the film is melting (EPD1) and the time when all the patterns are formed (EPD2) were measured. The results are shown in Table 3 below.

TABLE 1

Observation result of chemical resistance of Experimental Example 2

| | |
|---|---|
| Examples 1, 2, 3, 4 and 5 | FIG. 1 |
| Example 6 | FIG. 2 |
| Comparative Example 1, 2 and 3 | FIG. 3 |
| Reference Example 1 | FIG. 4 |

TABLE 2

Evaluation results of Experimental Examples 1 and 2

| Category | Copolymer | Experimental Example 1 | Experimental Example 2 |
|---|---|---|---|
| Example 1 | Synthesis Example 1 | ○ | ○ |
| Example 2 | Synthesis Example 2 | ○ | ○ |
| Example 3 | Synthesis Example 3 | ○ | ○ |
| Example 4 | Synthesis Example 4 | ○ | ○ |
| Example 5 | Synthesis Example 5 | ○ | ○ |
| Example 6 | Synthesis Example 6 | ○ | ○ |
| Comparative Example 1 | KBPN-110 | Δ | Δ |
| Comparative Example 2 | Comparative Synthesis Example 1 | X | X |
| Comparative Example 3 | Comparative Synthesis Example 2 | X | X |
| Reference Example 1 | Reference Synthesis Example 1 | Δ | X |

As shown in Table 2 above, it was confirmed that the photosensitive resin compositions of the Examples using the copolymers obtained in Synthesis Examples 1 to 6 as the binder resin were excellent in the chemical resistance and migration properties due to the post-processing even when performing post-baking at a temperature of 100° C., unlike Comparative Example 1 to which a general thermal-curable resin was applied. In addition, it was confirmed that in the case of a copolymer having no first (meth)acrylate repeating unit in which an organic functional group including an epoxy group was bonded to the terminal of the branched chain, as in Comparative Example 2 using the resin obtained in Comparative Synthesis Example 1, and in Comparative Example 3 using the copolymer obtained in Comparative Synthesis Example 2, the chemical resistance and migration properties due to the post-processing were poor as compared with the Examples.

Further, as in Reference Example 1 using the copolymer obtained in Reference Synthesis Example 1, even when the content of the first (meth)acrylate repeating unit in which the organic functional group including an epoxy group was bonded to the terminal of the branched chain was extremely reduced to 2.1 mol %, it was confirmed that the chemical resistance and migration properties due to the post-processing were poor as compared with the Examples.

Thereby, it was confirmed that the alkali soluble, photo-curable and thermo-curable copolymers obtained in Synthesis Examples 1 to 6 showed excellent curing properties even at low temperatures compared to conventional thermal-curable binder resins, thereby forming cured films having excellent heat resistance and chemical resistance.

TABLE 3

Results of Experimental Example 3

| Category | Copolymer | Development time (EPD1) (unit: sec) | Development time (EPD2) (unit: sec) |
|---|---|---|---|
| Example 1 | Synthesis Example 1 | 32 | 60 |
| Example 2 | Synthesis Example 2 | 32 | 60 |
| Example 3 | Synthesis Example 3 | 33 | 60 |
| Example 4 | Synthesis Example 4 | 31 | 60 |
| Example 5 | Synthesis Example 5 | 33 | 60 |
| Example 6 | Synthesis Example 6 | 31 | 60 |
| Comparative Example 1 | KBPN-110 | 60 | 80 |

As can be seen from the results of Table 3, it was confirmed that in the case of the Examples according to the present invention, it exhibited shorter development time and had excellent development property when compared with Comparative Example 1 to which a general thermal-curable resin was applied.

The invention claimed is:
1. An alkali soluble, photo-curable and thermo-curable copolymer comprising:
   a first (meth)acrylate repeating unit having a branched chain in which an organic functional group including an epoxy group is bonded to a terminal of the branched chain;
   a second (meth)acrylate repeating unit having a branched chain in which an organic functional group including an alkenyl group is bonded to a terminal of the branched chain; and
   a third (meth)acrylate repeating unit having a branched chain in which an organic functional group including an alkenyl group is bonded to a terminal of the branched chain,
   wherein in the second (meth)acrylate repeating unit, the branched chain includes any one functional group selected from an alkyl ester group having 1 to 20 carbon atoms substituted with a hydroxy group; an oxyalkyl ester group having 1 to 20 carbon atoms substituted with a hydroxy group; an alkyl ester group substituted by a cycloalkyl group having 3 to 30 carbon atoms substituted with a hydroxy group; a polycyclic alkyl ester group having 7 to 30 carbon atoms substituted with a hydroxy group; and an alkyl ester group substituted by a polycyclic alkyloxy group having 7 to 30 carbon atoms substituted with a hydroxy group,
   wherein in the third (meth)acrylate repeating unit, the branched chain includes any one functional group selected from an alkyl ester group having 1 to 20 carbon atoms in which a substituent containing a carboxyl group is introduced to the terminal; an oxyalkyl ester group having 1 to 20 carbon atoms in which a substituent containing a carboxyl group is introduced to the terminal; an alkyl ester group substituted by a cycloalkyl group having 3 to 30 carbon atoms in which a substituent containing a carboxyl group is introduced to the terminal; a polycyclic alkyl ester group having 7 to 30 carbon atoms in which a substituent containing a carboxyl group is introduced to the terminal; and an alkyl ester group substituted by a polycyclic alkyloxy group having 7 to 30 carbon atoms in which a substituent containing a carboxyl group is introduced to the terminal, and
   wherein the organic functional group including the epoxy group includes any one functional group of a functional group represented by Chemical Formula 2 and a functional group represented by Chemical Formula 3:

[Chemical Formula 2]

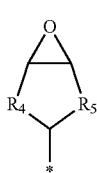

in the Chemical Formula 2, $R_4$, and $R_5$ are each independently a direct bond, or an alkylene group having 1 to 5 carbon atoms,

[Chemical Formula 3]

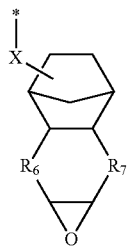

in the Chemical Formula 3, $R_6$, and $R_7$ are each independently a direct bond, or an alkylene group having 1 to 5 carbon atoms, and X is a direct bond, —O—, or —S—.

2. The alkali soluble, photo-curable and thermo-curable copolymer according to claim 1, wherein the first (meth)acrylate repeating unit is contained in an amount of at least 5 mol % based on the total of the repeating units contained in the copolymer.

3. The alkali soluble, photo-curable and thermo-curable copolymer according to claim 1, wherein a molar content of the first (meth)acrylate repeating unit is 20 moles or more and 500 moles or less based on the total mole number 100 moles of the second (meth)acrylate repeating unit and the third (meth)acrylate repeating unit.

4. The alkali soluble, photo-curable and thermo-curable copolymer according to claim 1, wherein the branched chain in the first (meth)acrylate repeating unit includes any one functional group selected from a carbonyl group; an alkyl ester group having 1 to 20 carbon atoms; and an oxyalkyl ester group having 1 to 20 carbon atoms.

5. The alkali soluble, photo-curable and thermo-curable copolymer according to claim 1, wherein the first (meth)acrylate repeating unit is represented by Chemical Formula 4:

[Chemical Formula 4]

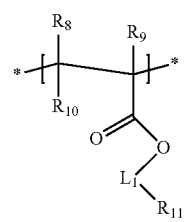

in the Chemical Formula 4,
$R_8$ to $R_{10}$ are each independently hydrogen or an alkyl group having 1 to 10 carbon atoms,
$L_1$ is a direct bond, an alkylene group having 1 to 20 carbon atoms or an oxyalkylene group having 1 to 20 carbon atoms, and
$R_{11}$ is the organic functional group including an epoxy group.

6. The alkali soluble, photo-curable and thermo-curable copolymer according to claim 1, wherein the organic functional group including the alkenyl group contained in the second (meth)acrylate repeating unit and the third (meth)acrylate repeating unit includes a (meth)acryloyl group or a (meth)acryloyloxy group.

7. The alkali soluble, photo-curable and thermo-curable copolymer according to claim 1, wherein the second (meth)acrylate repeating unit is represented by Chemical Formula 5:

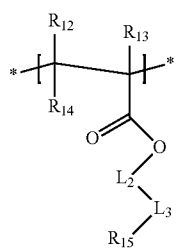

[Chemical Formula 5]

in the Chemical Formula 5, $R_{12}$ to $R_{14}$ are each independently hydrogen or an alkyl group having 1 to 10 carbon atoms, $L_2$ is a direct bond, an alkylene group having 1 to 20 carbon atoms, or an oxyalkylene group having 1 to 20 carbon atoms, $L_3$ is an alkylene group having 1 to 20 carbon atoms substituted with a hydroxy group, an oxyalkylene group having 1 to 20 carbon atoms substituted with a hydroxy group, a cycloalkylene group having 3 to 30 carbon atoms substituted with a hydroxy group, or a polycyclic alkylene group having 7 to 30 carbon atoms substituted with a hydroxy group, and $R_{15}$ is the organic functional group including an alkenyl group.

8. The alkali soluble, photo-curable and thermo-curable copolymer according to claim 1, wherein the substituent containing a carboxyl group at the terminal contained in the third (meth)acrylate repeating unit is represented by Chemical Formula 6:

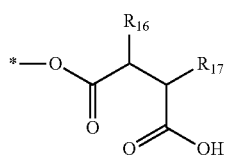

[Chemical Formula 6]

in the Chemical Formula 6, $R_{16}$ and $R_{17}$ are each independently hydrogen, or are bonded to each other to form an aliphatic ring or aromatic ring.

9. The alkali soluble, photo-curable and thermo-curable copolymer according to claim 1, wherein the third (meth)acrylate repeating unit is represented by Chemical Formula 7:

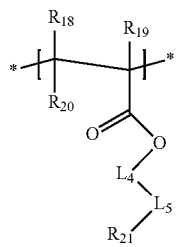

[Chemical Formula 7]

in the Chemical Formula 7, $R_{18}$ to $R_{20}$ are each independently hydrogen or an alkyl group having 1 to 10 carbon atoms, $L_4$ is a direct bond, an alkylene group having 1 to 20 carbon atoms, or an oxyalkylene groups having 1 to 20 carbon atoms, $L_5$ is an alkylene group having 1 to 20 carbon atoms in which a substituent containing a carboxyl group at the terminal is introduced to a terminal end of the alkylene group, an oxyalkylene group having 1 to 20 carbon atoms in which a substituent containing a carboxy group at the terminal is introduced to a terminal end of the oxyalkylene group, a cycloalkylene group having 3 to 30 carbon atoms in which a substituent containing a carboxy group is introduced to a terminal end of the cycloalkylene group, or a polycyclic alkylene group having 7 to 30 carbon atoms in which a substituent containing a carboxyl group is introduced to a terminal end of the polycyclic alkylene group, and $R_{21}$ is the organic functional group including an alkenyl group.

10. The alkali soluble, photo-curable and thermo-curable copolymer according to claim 1, wherein a molar ratio between the second (meth)acrylate repeating unit and the third (meth)acrylate repeating unit is 99:1 to 1:99.

11. The alkali soluble, photo-curable and thermo-curable copolymer according to claim 1, wherein a molar ratio between the first (meth)acrylate repeating unit and the third (meth)acrylate repeating unit is 99:1 to 1:19.

12. The alkali soluble, photo-curable and thermo-curable copolymer according to claim 1, wherein a molar ratio between the first (meth)acrylate repeating unit and the second (meth)acrylate repeating unit is 99:1 to 1:19.

13. The alkali soluble, photo-curable and thermo-curable copolymer according to claim 1, wherein an acid value of the copolymer is 20 KOH mg/g to 150 KOH mg/g.

14. The alkali soluble, photo-curable and thermo-curable copolymer according to claim 1, further comprising one or more repeating units selected from the group consisting of:

a fourth (meth)acrylate repeating unit represented by Chemical Formula 8;

a maleimide repeating unit represented by Chemical Formula 9; and one or more repeating units selected from the group consisting of vinyl repeating units represented by Chemical Formula 10,

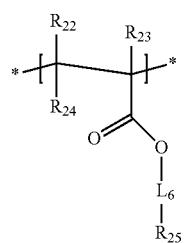

[Chemical Formula 8]

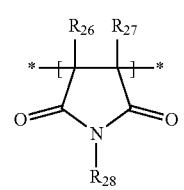

[Chemical Formula 9]

-continued

[Chemical Formula 10]

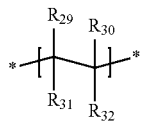

in the Chemical Formulae 8 to 10, $R_{22}$ to $R_{32}$ are each independently any one functional group selected from hydrogen; deuterium; a halogen group; an alkyl group having 1 to 20 carbon atoms; an alkoxy group having 1 to 20 carbon atoms; a monocyclic or polycyclic aryl group having 6 to 30 carbon atoms; an alkenyl group having 2 to 20 carbon atoms; and a monocyclic or polycyclic cycloalkyl group having 3 to 30 carbon atoms, and $L_6$ is a direct bond, an alkylene group having 1 to 20 carbon atoms, or an oxyalkylene groups having 1 to 20 carbon atoms.

15. A photosensitive resin composition comprising:
the alkali soluble, photo-curable and thermo-curable copolymer of claim 1;
a photopolymerizable monomer having two or more photocurable unsaturated functional groups; and
a photo-initiator.

16. The photosensitive resin composition according to claim 15, further comprising a pigment.

17. A photosensitive resin film comprising a cured product of the photosensitive resin composition of claim 15.

18. A color filter comprising the photosensitive resin film of claim 17.

* * * * *